(12) United States Patent
Chai et al.

(10) Patent No.: US 7,397,034 B2
(45) Date of Patent: Jul. 8, 2008

(54) METHOD OF ENHANCING PERFORMANCE OF DOPED SCINTILLATION CRYSTALS

(75) Inventors: Bruce H. T. Chai, Oviedo, FL (US); David Y. Chai, Oviedo, FL (US); Randall A. Lux, Fern Park, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 473 days.

(21) Appl. No.: 11/230,167

(22) Filed: Sep. 19, 2005

(65) Prior Publication Data

US 2006/0011845 A1 Jan. 19, 2006

Related U.S. Application Data

(63) Continuation-in-part of application No. 10/754,850, filed on Jan. 9, 2004, now Pat. No. 7,166,845, and a continuation-in-part of application No. 10/754,238, filed on Jan. 9, 2004, now Pat. No. 7,151,261.

(51) Int. Cl.
 *G01T 1/20* (2006.01)
(52) U.S. Cl. .................................. 250/361 R; 250/362
(58) Field of Classification Search ............. 250/361 R, 250/362
 See application file for complete search history.

(56) References Cited

U.S. PATENT DOCUMENTS

| | | | |
|---|---|---|---|
| 4,055,391 A | 10/1977 | Schmidt et al. | 432/264 |
| 5,164,041 A | 11/1992 | Berkstresser et al. | 156/617 |
| 5,324,488 A | 6/1994 | Klingshirn et al. | 117/213 |
| 5,481,114 A | 1/1996 | Daniel et al. | 250/390.11 |
| 5,483,070 A | 1/1996 | Valenta | 250/366 |
| 5,540,947 A | 7/1996 | Morlotti et al. | 427/65 |
| 5,660,627 A | 8/1997 | Manente et al. | 117/13 |
| 5,680,423 A * | 10/1997 | Perkins et al. | 376/153 |
| 5,690,731 A | 11/1997 | Kurata et al. | 117/13 |
| 6,278,832 B1 * | 8/2001 | Zagumennyi et al. | 385/141 |
| 6,323,489 B1 | 11/2001 | McClellan | 250/361 R |
| 6,462,341 B1 | 10/2002 | Muehllehner | 250/363.03 |
| 6,551,231 B1 * | 4/2003 | Bliss et al. | 600/1 |

(Continued)

OTHER PUBLICATIONS

"Investigation of the Properties of New Scintillator LYSO and Recent LSO Scintillators for Phoswich PET Detectors", 2002 IEEE Nuclear Science Symposium Conference Record, 2002 IEEE Nuclear Science Symposium Conference Norfolk, VA Nov. 10-16, 2002, IEEE Nuclear Science Symposium Conference Record, Ney York, NY, IEEE, US, vol. 3 of 3, Nov. 10, 2002, pp. 655-660, XP010663616, ISBN: 0-7803-7636-6.

(Continued)

*Primary Examiner*—David P. Porta
*Assistant Examiner*—Djura Malevic
(74) *Attorney, Agent, or Firm*—Allen, Dyer, Doppelt, Milbrath & Gilchrist, P.A.

(57) ABSTRACT

A method for enhancing the light yield of a doped scintillation crystal may include a reducing step if the crystal includes a dopant, such as cerium in a first oxidation state, such as the 4+ state. The scintillation crystal may include a rare earth silicate. The reducing may include heating in an oxygen-free ambient. The reducing may be used after an oxygen vacancy filling step that causes at least some of the dopant to increase in its oxidation state.

24 Claims, 11 Drawing Sheets

U.S. PATENT DOCUMENTS

| | | | |
|---|---|---|---|
| 6,624,420 B1 | 9/2003 | Chai et al. | 250/361 |
| 6,643,538 B1 | 11/2003 | Majewski et al. | 600/436 |
| 6,664,543 B2 | 12/2003 | Moyers et al. | 250/369 |
| 6,671,541 B2 | 12/2003 | Bishop et al. | 600/436 |
| 6,822,237 B2 | 11/2004 | Inoue et al. | 250/363.06 |
| 6,903,344 B2 | 6/2005 | Breeding et al. | 250/363.03 |
| 6,921,901 B1 | 7/2005 | Chai et al. | 250/361 |
| 6,995,374 B2 | 2/2006 | LeFaucheur et al. | 250/370.11 |
| 2002/0144640 A1 | 10/2002 | Andreaco et al. | 117/2 |
| 2004/0084655 A1 | 5/2004 | Vartuli et al. | 252/301.4 |

OTHER PUBLICATIONS

Kobayashi et al., Abstract of "Radiation damage of cerium-doped lutetium oxyorthosilicate single crystal," Nuclear Instruments & Methods in Physics Rsearch, Section A: Accelerators, Spectrometers, Detectors, and Associated Equipment (1993), 335 (3), 509-12.

Chen et al., Proceedings of the International Conference on Inorganic Scintillators and Their Applications, pp. 185-188, Scint95, 1996, Delft University Press, The Netherlands.

Jermann et al., Proceedings of the International Conference on Inorganic Scintillators and Their Applications, pp. 388-391, Scint95, 1996, Delft University Press, The Netherlands.

Higgins et al., The Influence of Whole Boule Annealing on the Properties of Semi-Insulating Indium Phosphide, Interdisciplinary Research Centre for Semiconductor Materials, London, United Kingdom; presented at the Indium Phosphide and Related Materials (IPRM) Conference, Davos, Switzerland in May 1999.

"Crystal Growth and Optical Characterization of Cerium-Doped $Lu_{1.8}Y_{0.2}SiO_5$", Cooke et al., Journal of Applied Physics, American Institute of Physics, NY, US, vol. 88, No. 12, Dec. 15, 2000, pp. 7360-7362, XP012051142, ISSN: 0021-8979.

"High Efficiency of Lutetium Silicate Scintillators Ce-doped LPS and LYSO Crystals", Pidol et al., 2003 IEEE Nuclear Science Symposium Conference Record./ 2003 IEEE Nuclear Symposium and Medical Imaging Conference, Portland, OR, Oct. 19-25, 2003, IEEE Nuclear Science Symposium Conference Record, New York, NY:IEEE, US, vol. 5 of 5, Oct. 19, 2003, pp. 886-890vol. 12, XP010736350, ISBN: 0-7803-8257-9.

\* cited by examiner

FIG. 2 (LSO)
(PRIOR ART)

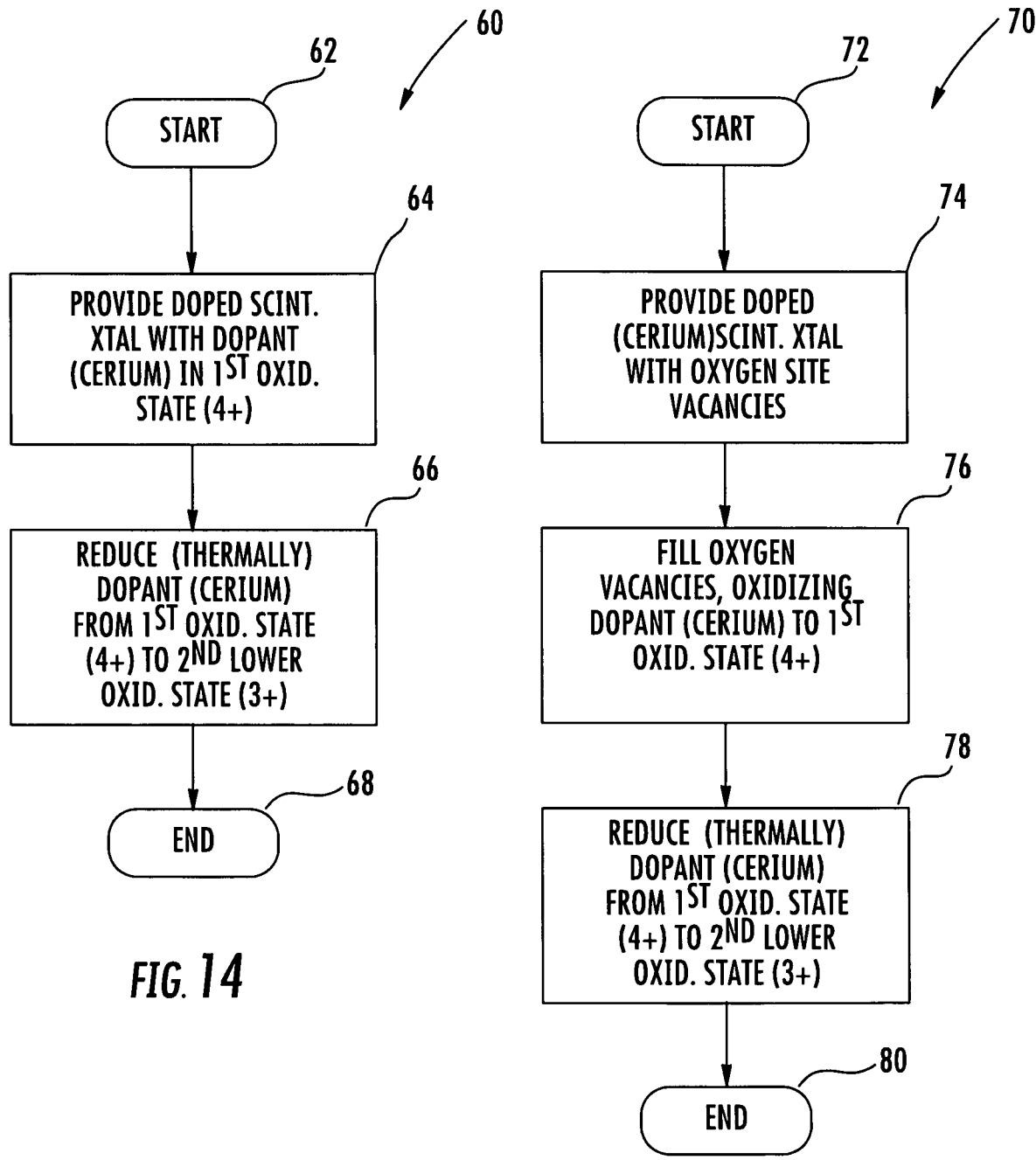

METHOD OF ENHANCING PERFORMANCE OF DOPED SCINTILLATION CRYSTALS

RELATED APPLICATIONS

The present application is a continuation-in-part application of U.S. patent application Ser. No. 10/754,850 now U.S. Pat. No. 7,166,845 and Ser. No. 10/754,238 now U.S. Pat. No. 7,151,261, both filed Jan. 9, 2004, the entire contents of which are incorporated herein by reference.

FIELD OF THE INVENTION

The present invention relates to the field of crystals and, more particularly, to a method of enhancing certain scintillation crystals to generate a greater light yield in response to irradiation with high energy radiation.

BACKGROUND OF THE INVENTION

Single crystal scintillation is a very simple but also very sensitive method of detecting high energy radiation such as x-rays, gamma-rays and high energy particles with energies exceeding a few kilo-electron volt (KeV). In the past century, a large number of crystals have been proposed for potential scintillating applications. For medical imaging such as positron emission tomographs (PET), crystals with the highest light yield, narrowest energy resolution and fastest decay time are required. Moreover, PET also requires a crystal with good physical integrity and chemical inertness. Thallium-activated sodium iodide, NaI(Tl) has by far the highest light yield of 38,000 photons per million-electron volt (MeV). Unfortunately, NaI(Tl) is hygroscopic which is not a desirable property in making the small detector pixels used in a PET system.

The first crystal used in a PET application was bismuth germanate (BGO), which has the general formula $Bi_4Ge_3O_{12}$. BGO is non-hygroscopic and has good physical properties. The problem of BGO is the relatively low light yield of 6,000 photons per MeV, or approximately 15% of the yield of NaI(Tl). BGO also has a long decay time of 300 nano-seconds (ns), which is too slow for the coincident detection employed in a PET system.

A much improved crystal for PET application was developed in the early 1980s. This is cerium doped gadolinium orthosilicate (GSO), which has the general formula $Ce:Gd_2SiO_5$. GSO exhibits the much shorter decay time of 60 ns and a light yield of approximately 10,000 photons per MeV, or 25% that of NaI(Tl).

In the early 1990s, cerium doped lutetium orthosilicate (LSO), having the general formula of $Ce:Lu_2SiO_5$, was discovered. LSO had, by far, may have the best overall properties. The decay time of LSO is only 47 ns and the light yield is 29,000 photons per MeV, or approximately 76% that of NaI(Tl). Even though LSO has excellent properties, it is not without problems. One of the most serious problems of LSO is the large variation of light yield from crystal boule to crystal boule and even from top to bottom within the same crystal boule. In the past, this variation has been attributed to impurities within the crystal, which generate color centers and thus quenche the radiative emission.

More recently, Chai et al. in U.S. Pat. No. 6,624,420 described the newest entry in scintillator crystals for PET, that is lutetium yttrium orthosilicate (LYSO) having the general composition of $Ce_{2x}(Lu_{1-y}Y_y)_{2(1-x)}SiO_5$ where x=0.00001 to 0.05 and y=0.0001 to 0.9999. LYSO also has very high light yield up to 96% that of NaI(Tl) and a similar fast decay time of 48 ns. At the same time, however, it may also suffer the same problem as LSO, that is, a large light yield variation from crystal boule to crystal boule, as well as from the top to the bottom of the same crystal boule, although the variation is much smaller than that of LSO. The smaller variation in light yield properties of LYSO was attributed to the substitution of yttrium, which has much higher purity than the lutetium source.

A large variation in light yield presents a serious problem for the construction of PET detector blocks. Ideally, it is preferred that all pixels within a detector block have the same light yield and energy resolution. Moreover, the spread of the light, or energy resolution is another important parameter in the design of the PET detector blocks. Ideally, it is preferable to have the energy resolution as narrow as possible. At the present time, neither BGO nor GSO suffers from the problem of non-uniformity in light yield and energy resolution. However, for both LSO and LYSO, these are persistent problems.

In the past, in order to provide PET detector blocks using either LSO or LYSO and having uniform performance, it would be necessary to carefully measure the light yield performance and energy resolution of each individual detector pixel. By manually selecting the pixels with nearly the same performance, it would be possible to build detector blocks having uniform performance. This is a very costly manufacturing process, however. To make the product competitive, it became necessary to develop a process that could eliminate this manual selection process and still identify all the detector pixels having the same performance.

Applicant believes, without wishing to be bound thereto, that the poor light yield performance of LSO is due to deep traps that take the energy away and dissipate it non-radiatively. However, very little is known about the exact nature of these non-radiative recombination centers. Since the starting material, $Lu_2O_3$, is only 99.95% in purity, it is believed that poor light yield performance was due to the impurities in the starting material from which the crystal is made. However, repeated chemical analyses of trace elements in both the $Lu_2O_3$ powder starting material and the whole crystal have failed to identify the exact impurity that quenches the light yield. Applicant has also intentionally added trace amounts of impurities in the starting powder mixture and then grown a LSO or LYSO crystal, but this approach failed to show any of the intended results of light quenching.

Even though both LSO and LYSO have the problem of serious light yield variation, Applicant has not found the same effect in cerium doped yttrium orthosilicate single crystal (YSO) having the general formula $Ce:Y_2SiO_5$. Moreover, while LSO has a strong afterglow which can last many hours after being radiated with UV light, Applicant has never observed a similar afterglow of YSO under the same UV radiation conditions. Since the starting material, $Y_2O_3$, for YSO is 99.999% in purity, the evidence tended to support the speculation that the light yield variation is due to the impurity of the $Lu_2O_3$ raw material.

In the development of the LYSO crystal, Applicant has also noticed the enhancement of light yield shown by LYSO over LSO, as well as much weaker afterglow for LYSO crystals with high yttrium content. At that time, this observation also supported the assumption that a high yttrium content LYSO crystal starts with less $Lu_2O_3$ and, therefore, has less impurities and thus better light yield.

Despite the seeming consistency of this pattern as indicating that impurities in the $Lu_2O_3$ raw material were the main cause of light yield reduction, the impurity or impurities which interfere with light yield has never been identified, even though Applicant has used a variety of $Lu_2O_3$ sources from many different vendors having different types and levels of impurities. In fact, the performance of both LSO and LYSO seems to be independent of the source of $Lu_2O_3$. Even when the same batch of chemicals is used, it is still possible to have a large variation in light yield from crystal boule to crystal boule. Given those circumstances, Applicant began to suspect that the cause of light yield variation is not really due to the impurity effect but due to other causes that are more fundamental and most likely related to the basic structure of the crystal.

YSO, LSO and LYSO have the same crystal structure, which is monoclinic with a space group of C2/c. The structure has two distinct rare earth cation sites. One is a distorted 7-fold coordinate site and the other one is a smaller distorted 6-fold coordinate site. These two sites are quite different from each other, with distinct energy levels for emission. When the crystal is doped with cerium, the dopant substitutes into both sites. The exact distribution ratio between the two sites is not known. However, since the emission spectra of Ce:LSO (FIG. 1) and Ce:YSO (FIG. 2) are not quite the same, it may be assumed that the Ce distribution between the two sites is different for Ce:LSO and Ce:YSO. For Ce:LYSO, because the crystal has a very high content of Lutetium (at least approximately 95%) and low Yttrium content (approximately less than 5%) the absorption and emission spectra are substantially the same as that of pure LSO.

Single crystals of YSO, LSO and LYSO are all produced by the Czochralski melt pulling technique as known in the art, since all three compositions melt congruently. However, the melting points of all three crystals are quite high, 1980° C., 2150° C. and 2100° C., respectively. To hold the molten charges at such high temperatures, it is necessary to use an iridium metal crucible as the container, which has a melting point of 2450° C. Even though iridium is quite inert and stable, it does oxidize in air at such high temperatures. To prevent metal loss of the iridium crucible, it is necessary to grow the crystals in either a vacuum or in furnaces purged with argon or nitrogen gas, so that the ambient oxygen in the growth chamber is kept below approximately 1%.

Even though the crystals grown in this method are colorless and transparent, Applicant theorizes without wishing to be bound thereto that there is some evidence that oxide crystals produced at such high temperatures under a low oxygen condition tension can generate oxygen vacancy point defect centers. These points defect centers could act as recombination centers that take away the radiative energy from an otherwise normal electron-hole recombination process. Even though such oxygen point defect centers are well known, they have not been implicated directly as the possible cause for low light yield in scintillating crystals.

During Applicant's extensive experience growing crystals of LSO, YSO and LYSO over the years, there have been a number of times that accidentally an air leakage developed in a growth chamber. This was highly undesirable, since the iridium crucible was badly burned to a purplish black color. The crystal surface, in those instances, was covered with small single crystal flakes of iridium metal released from the crucible. Generally, the process must be stopped right away to minimize further damage to the crucible and to the furnaces. In most of these cases a partially completed crystal is the result.

In these cases, however, even though LSO, YSO and LYSO all have the same crystallographic structure, the crystals produced under such highly oxygenated conditions are quite different from each other. For YSO, the crystal turns into a light yellow color, indicating oxidation of Ce from the 3+ to the 4+ state. Nevertheless, there is improvement of the light yield in these oxygenated crystals as compared with the regular YSO crystals.

For both LSO and LYSO crystals, the change from colorless to yellow is rarely seen. Most of these crystals are still transparent and colorless, but among these crystals, applicant noticed a definite improvement in light yield. When grown using the prior process of reduced oxygen, the typical light yield for an LSO crystal is about 4× that of BGO, but occasionally a crystal having 5× BGO light yield may be obtained, although rarely. Surprisingly, however, Applicant discovered that these accidentally air-leaked LSO crystals generally showed 5× or even better light yield over BGO, which is exceptionally good. For LYSO crystals, the results were even better. It was possible to obtain as much as 6× or more the light yield of BGO. Moreover, the improvement appeared to be independent of the source of $Lu_2O_3$. In other words, Applicant theorizes without wishing to be bound thereto that the improvement is unrelated to the degree of original impurities found in the crystal, or to the reduction thereof.

Because of the result of these air-leaked crystals, applicant has tried to increase the oxygen content in the growth chamber to improve the light yield. Unfortunately, applicant is not able to increase the oxygen too much without worrying about the damage of the Iridium crucible. The net result of these crystals with increasing oxygen content did not show any significant improvement in light yield within the experimental variation range. So applicant concluded that increased oxygen during growth is not an effective way to oxygenate the crystal. This result is totally consistent with the phase diagram illustrated in FIG. 11 as will be discussed in greater detail below.

Still the result of these air-leaked crystals shows for the first time a direct linkage between the light yield and the chemical nature of the crystal, i.e., crystal with exposure of high ambient oxygen during cooling has better light yield. On the other hand, applicant did not see any direct linkage of a specific impurity (within the impurity range of the normal 99.95% pure $Lu_2O_3$) to the light yield, nevertheless, and applicant can not rule out that high impurity within the crystal can also damage the light yield performance.

SUMMARY OF THE INVENTION

In view of the foregoing background, it is therefore an object of the present invention to provide a method for enhancing the performance of a scintillation crystal, such as comprising a doped rare earth silicate.

This and other objects, features and advantages in accordance with the present invention are provided by a method for treating a doped scintillation crystal by a reducing step. The doped scintillation crystal may comprise a doped rare earth silicate, and the dopant may comprise a rare earth different than the rare earth silicate. The treatment may enhance, for example, the light yield of the doped scintillation crystal. The rare earth silicate may be selected from the group consisting of lutetium oxyorthosilicate (LSO), lutetium yttrium oxyorthosilicate (LYSO), yttrium oxyorthosilicate (YSO), gadolinium oxyorthosilicate (GSO), gadolinium yttrium oxyorthosilicate (GYSO), lutetium gadolinium oxyorthosilicate (LGSO), and lutetium gadolinium yttrium oxyorthosilicate (LGYSO). In addition, the dopant may be selected from the group consisting of cerium and scandium. The first oxidation state may be a 4+ oxidation state and the second oxidation state may be a 3+ oxidation state. The reducing may be applicable to other doped scintillation crystals as well.

The reducing may be performed thermally and may be done in an oxygen-free ambient. For example, the heating may include heating at a temperature in a range of about 1100° C. to 1400° C. for a time in a range of about two to five hours.

The reducing may be used by itself to remediate scintillation crystals that have low light yield and as may appear yellow as indicative of the presence of the 4+ oxidation state of the cerium dopant, for example. In addition, the reducing can be used in combination with an initial manufacturing treatment step that enhances crystal performance by filling oxygen vacancies in the crystal as described in the parent applications which have been found to show significant enhancements. Accordingly, another method aspect of the invention is directed to a method of enhancing performance of a doped scintillation crystal having oxygen vacancies therein. This method may comprise adding oxygen to fill at least some of the oxygen vacancies and having an effect of oxidizing the dopant to a first oxidation state, and reducing at least some of the dopant from the first oxidation state to a second oxidation state lower than the first oxidation state. Adding oxygen may comprise heating the doped scintillation crystal in an oxygen containing ambient.

BRIEF DESCRIPTION OF THE DRAWINGS

FIG. 14 is a flow diagram showing a first embodiment of the method of the present invention.

FIG. 15 is a flow diagram showing a second embodiment of the method of the present invention incorporating the portions shown in FIGS. 4 and 8.

DETAILED DESCRIPTION OF THE PREFERRED EMBODIMENTS

Figure 1:
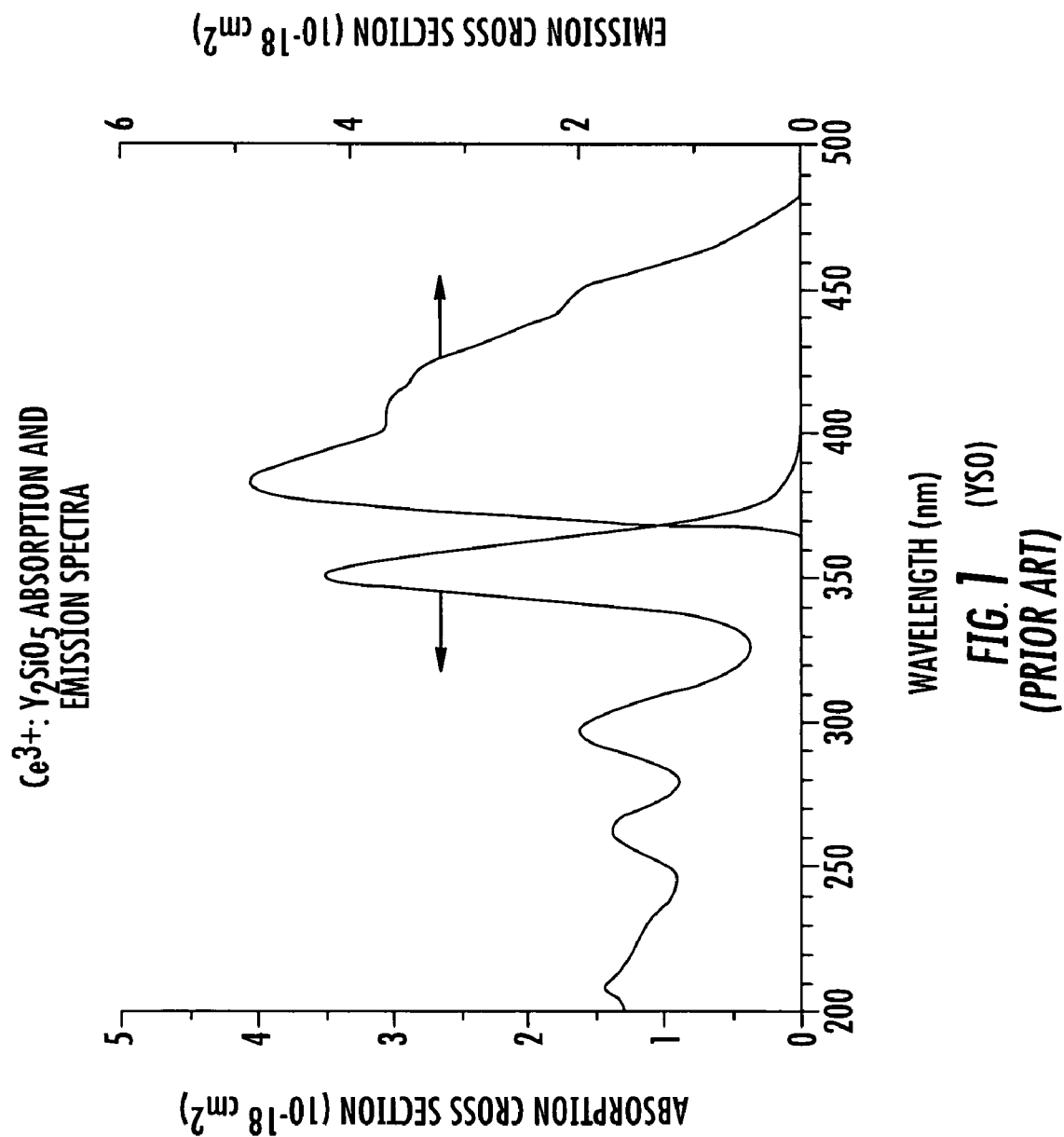
FIG. 1 is a line graph showing the absorption and emission spectra of YSO, as in the prior art.
Figure 2:
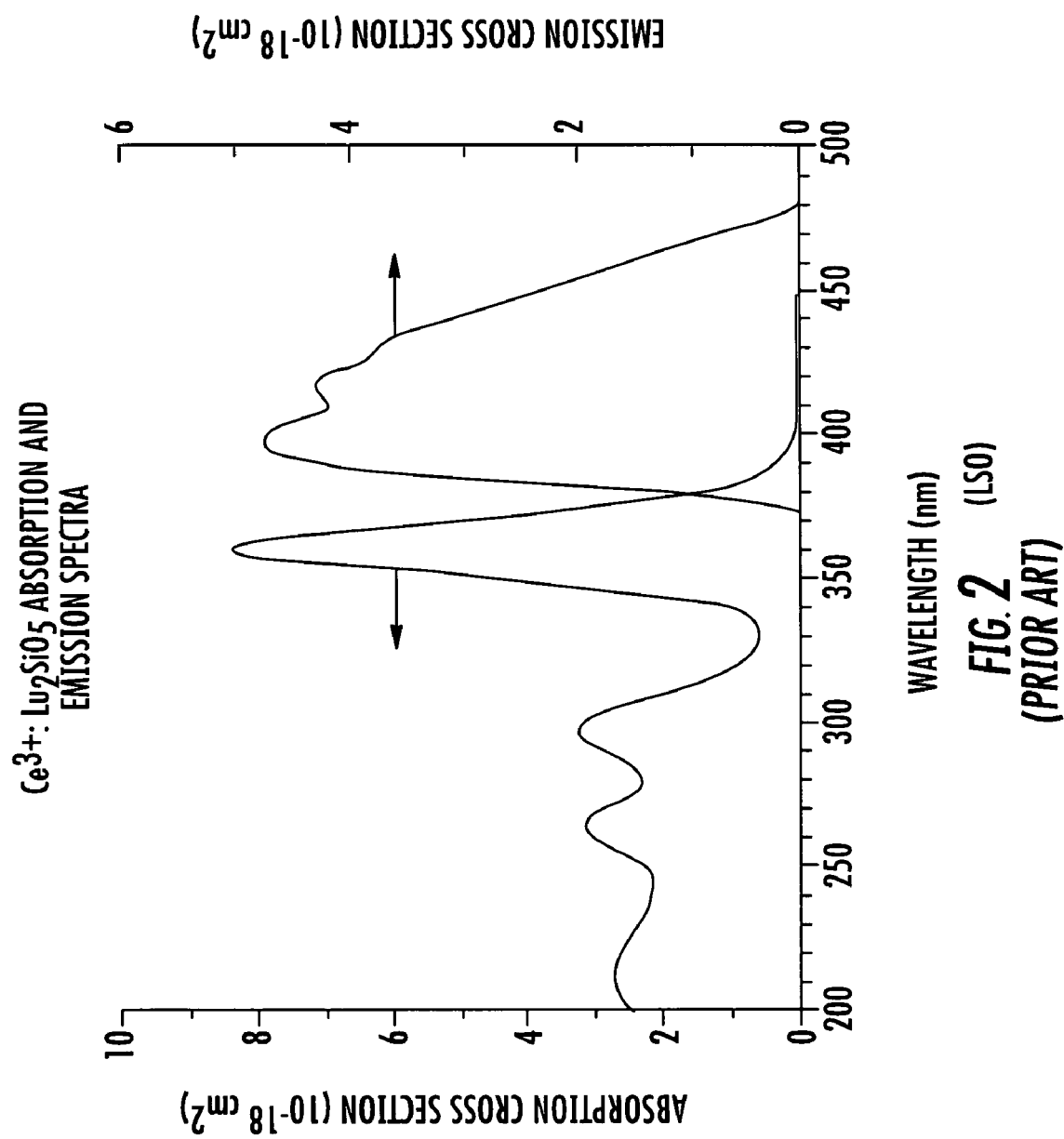
FIG. 2 shows a line graph depicting the absorption and emission spectra of LSO, as in the prior art.

The present invention will now be described more fully hereinafter with reference to the accompanying drawings, in which preferred embodiments of the invention are shown. Unless otherwise defined, technical and scientific terms used herein have the same meaning as commonly understood by one of ordinary skill in the art to which this invention pertains. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including any definitions, will control. In addition, the materials, methods and examples given are illustrative in nature only and not intended to be limiting. Accordingly, this invention may be embodied in many different forms and should not be construed as limited to the illustrated embodiments set forth herein. Rather, these illustrated embodiments are provided solely for exemplary purposes so that this disclosure will be thorough and complete, and will fully convey the scope of the invention to those skilled in the art. Other features and advantages of the invention will be apparent from the following detailed description, and from the claims.

For illustrative purposes, a representative embodiment of the invention is described hereafter in the context of the detection of high energy gamma rays. It should be understood that the oxygenated single crystal scintillator of the invention is not limited to the detection of gamma ray radiation but it has general applications for the detection of other types of radiation such as x-rays, cosmic and other high energy particle rays.

In the background review, it is noted that Ce doped LYSO has superior scintillating properties among known non-hygroscopic scintillators. It also includes its two end members, YSO where y=1.00 and LSO where y=0.00. A previously recognized problem with this family of compounds is the large variation of the light yield from crystal to crystal and even from top to bottom in the same crystal boule. It now appears that these variations are not primarily due to impurities within the crystal but, rather, are related to the oxygenation state of the material. Crystals that are highly oxygenated usually produce a much higher light yield than crystals having oxygen vacancies within their structure.

The present invention may include a process which can oxygenate the crystal and thus greatly improve its light yield performance. These crystals are produced by the Czochralski melt pulling technique known in the art, using an iridium crucible at extremely high temperatures which are near or exceed 2000° C. Therefore, to prevent excessive oxidation and corrosion of the iridium crucible, it is typically desired to reduce the content of oxygen within the growth chamber. All crystals typically produced through this prior art technique are made under low oxygen conditions. As a result, based on experimental observations Applicant theorizes without wishing to be bound thereto, that these conventionally produced crystals are formed having oxygen vacancy point defects within the crystal lattice. Unfortunately, this oxygen defect condition has been previously overlooked by those of skill in this art. Applicant believes this problem has not been recognized before because crystals having oxygen vacancy defects are visually unremarkable, that is, there is no visual clue that there may be something about the crystal that is less than optimal. Since the traditional concept of the impurity effect on crystal performance is deeply rooted in the art, and the $Lu_2O_3$ starting chemicals are not completely pure, it was easy to assume that impurities are the primary cause of the reduction in the light yield produced by these crystals. Thus, the problem and its solution continued unrecognized until now.

Having realized that low light yield in these crystals may be directly related to oxygen vacancy defects in the crystal, it became desirable to develop a process for producing crystals without the defect. It was also clear that increasing the oxygen concentration during formation of the crystals may lead to damage of the iridium crucible due to uncontrolled oxidation at the high temperatures used for crystal formation.

Thus, the present invention provides a method of oxygenating these crystals, to reduce or eliminate the oxygen vacancy point defects and to restore the intrinsic light yield characteristics of YSO, LSO and LYSO crystals, for example. Since the oxygenation process requires adding oxygen into the crystal structure without destroying the crystal itself, it was determined that thermal diffusion might provide a suitable approach.

One should clearly differentiate between thermal annealing and thermal oxygenation processes, even though the basic tool to achieve both effects may be similar. Thermal annealing is a heat treatment process normally used in removing the stress within a crystal or to homogenize the physical or chemical properties of a crystal. Only thermal energy is needed for the process. Thermal annealing can be performed in air, in a vacuum, or in an inert gas, and regardless of the atmosphere there is no difference in the result since there is no chemical change induced within the crystal. A thermal oxygenation process, on the other hand, requires both thermal energy as well as the availability of oxygen. In essence, it is a thermal diffusion of oxygen into the crystal so as to eliminate the oxygen vacancy. Since oxygen is a fairly large molecule, under normal conditions it would not be possible to diffuse oxygen into the crystal structure. Therefore, to improve the diffusion process, heat is applied to the crystal to a certain temperature so that the atoms within the crystal structure are in a highly agitated state, which also increases the spacing of the atoms within the crystal lattice. This increased spacing in the crystal will also facilitate the diffusion of oxygen into the structure. So, in the thermal oxygenation process small amounts of oxygen are added to the crystal by diffusion. Since the diffusion of oxygen into the crystal is a very slow process, it would be of advantage to speed up the oxygenation. One approach would be to require at least one of the dimensions of the crystal to be small. In other words, the crystal is best shaped as a rod or a plate, and preferably should have the smallest dimension being no greater than 10 mm. For thicker samples, the total time needed for oxygenation may be too long to be practical for commercial use.

It is possible to increase the temperature to facilitate the oxygenation process, however, increasing the temperature also increases the risk of oxidizing the Ce ion in the crystal from a 3+ charge state to a 4+. When this occurs, the crystal turns a yellow color. Also, in the more highly oxidized state the $Ce^{4+}$ is no longer an emitting ion. Thus, the light yield of the crystal will be reduced as the total number of the emitting ions is reduced.

One can always increase the temperature to facilitate the oxygenation process. However, it also renders the risk of oxidizing Ce ion from 3+ state to the 4+ state. By doing so, the crystal will turn yellow in color and the $Ce^{4+}$ is not an emitting ion. So the light yield will be reduced due to both the reduction of total number of the emitting ions and the self-absorption of the $Ce^{4+}$ ion.

Thermal oxygenation is the correct process to eliminate the oxygen vacancy defect and to increase the light yield. However, the oxidation of Ce ion from 3+ to 4+ state is a highly undesirable process since it will reduce the light yield of the crystal. So in the process of finding the right conditions for the thermal oxygenation process, we have found by trial and error a limited temperature and time range to ensure the filling of oxygen in the defect centers and to avoid the oxidation of Ce ion. For LSO with a fixed crystal composition, the process would be fine and consistent. LYSO with high Lu content seems also works fine with thermal oxygenation treatment. However, for LYSO crystal with an increased Y content, the temperature and time range for thermal oxygenation process seems to be much more restricted. It becomes very easy to turn the crystal into yellow color with the treatment. In the extreme case with pure YSO, thermal oxygenation always ended with a yellow crystal. Based on thermodynamics, during thermal oxygenation process, there are two redox reactions occur within the crystal. We can write the two reactions as following:

  (A)

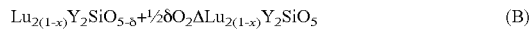  (B)

Figure 8:
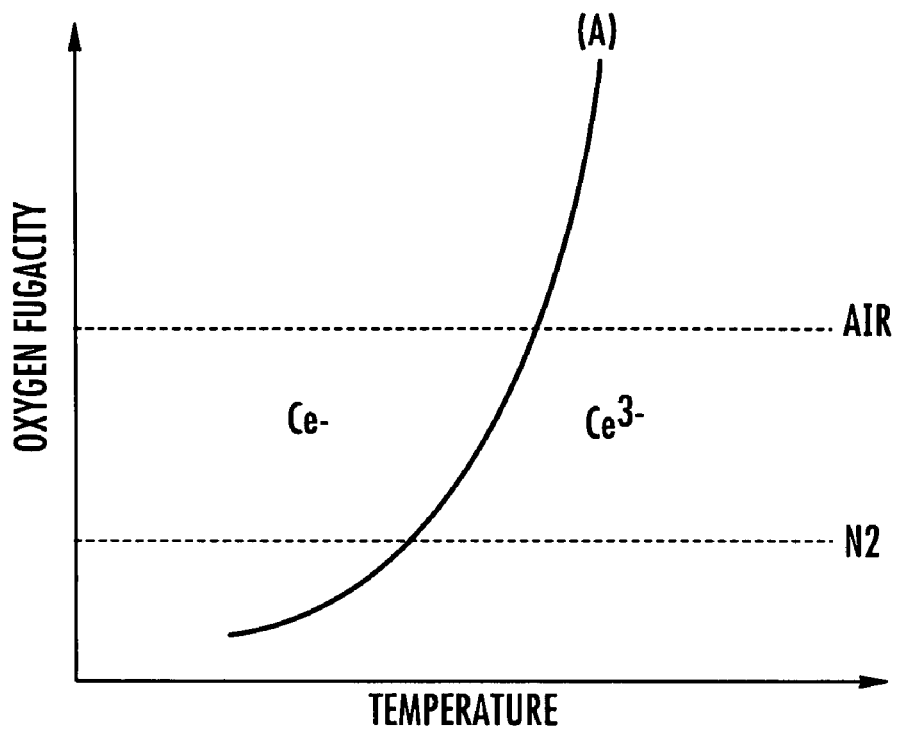
FIG. 8 is a schematic plot of the phase equilibrium boundary of the reaction (A) in an oxygen fugacity vs. temperature diagram.
Figure 9:
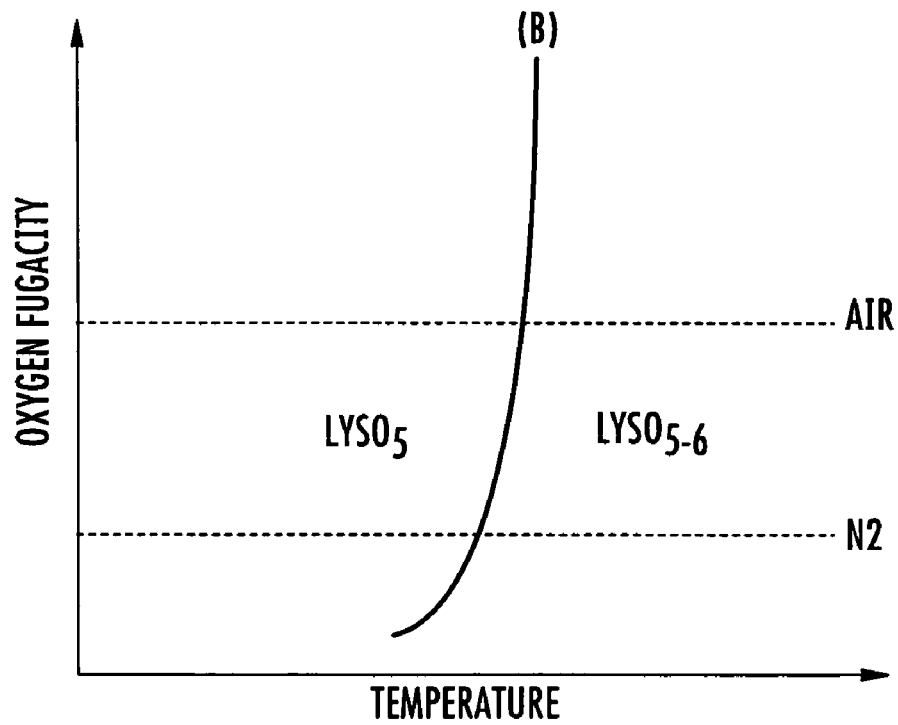
FIG. 9 is a schematic plot of the phase equilibrium boundary of the reaction (B) in an oxygen fugacity vs. temperature diagram.

Reaction (A) is the oxidation of $Ce^{3+}$ to $Ce^{4+}$. Reaction (B) is the thermal oxygenation of LYSO. What we like to achieve is the completion of Reaction (B) without initiation of Reaction (A). Since both reactions are reversible from thermodynamic point of view, we could plot the phase equilibrium curve of both reactions on an oxygen fugacity versus temperature diagram as seen in FIGS. 8 and 9. The general shape of such phase equilibrium curves is known. Because of lack of the needed thermodynamic data, applicant does not know the exact position of each curve nor their relative position. On the other hand, applicant has done massive amount of thermal oxygenation treatment in the past two years. The data seem to indicate that Reaction (A) is sensitive to both temperature and the partial pressure of oxygen (or oxygen fugacity). So the curve will gentler as shown in FIG. 8. On the other hand, Reaction (B) seems less sensitive to oxygen partial pressure but more on temperature, so the curve will be steeper as shown in FIG. 9. However, the exact position and shape of these two reaction curves is of no consequence, the argument assumes their relative position.

Figure 10:
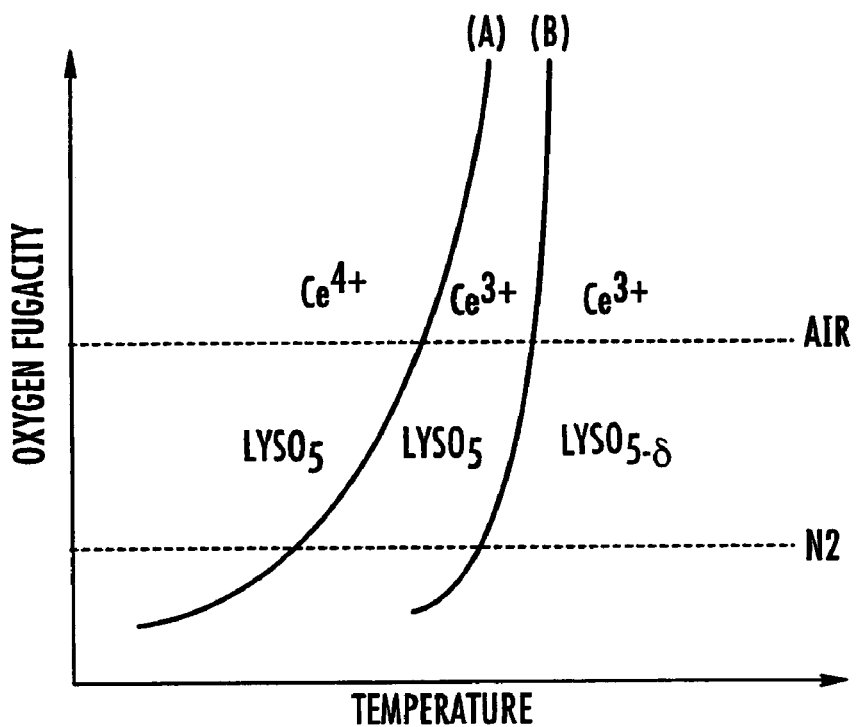
FIG. 10 is an oxygen fugacity vs. temperature diagram illustrating schematic plots of the phase equilibrium boundaries of reaction (A) and (B) based on scenario I.

Scenario I: Reaction (A) is at the lower temperature (left) side of reaction (B). The relative positions of the two reactions and the regions of stable phases are shown in FIG. 10. In this Scenario, it is possible to find a region (area between Reaction (A) and (B) in FIG. 10 such that the $Ce^{3+}$ is stable and the fully oxygenated LYSO is stable. However, since the oxygenation process in Reaction (B) is diffusion limited, a higher temperature without exceeding the phase boundary may be the best condition to process the crystal.

Figure 11:
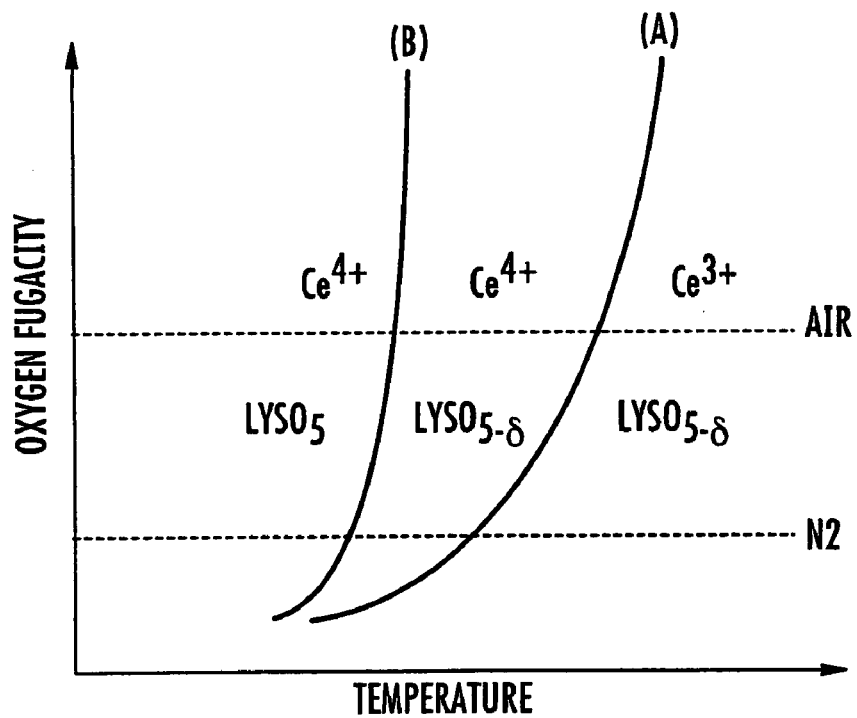
FIG. 11 is an oxygen fugacity vs. temperature diagram illustrating schematic plots of the phase equilibrium boundaries of reaction (A) and (B) based on scenario II.

Scenario II: Reaction (B) is at the lower temperature (left) side of reaction (A). The relative positions of the two reactions and the regions of stable phases are shown in FIG. 11. In this Scenario, it is not possible to find a region such that the $Ce^{3+}$ is stable and the fully oxygenated LYSO is also stable. Instead, the same region (area between (B) and (A) in FIG. 11 between the two reactions will have the $Ce^{4+}$ and de-oxygenated LYSO as the stable phase. So under this condition, it is theoretically not possible to achieve the goal by thermal oxygenation alone.

Figure 12:
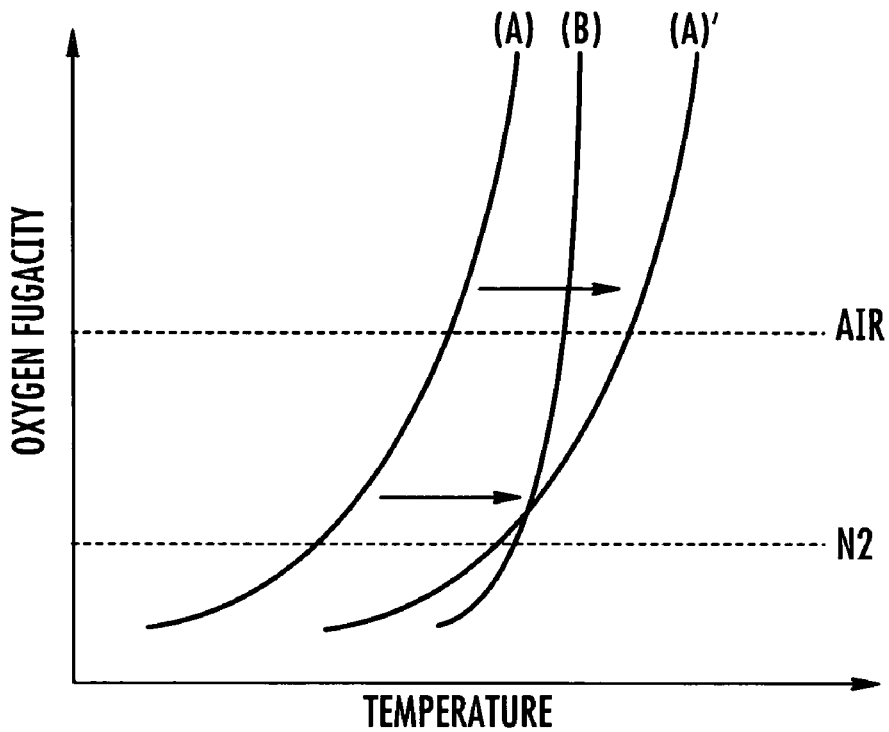
FIG. 12 is an oxygen fugacity vs. temperature diagram illustrating schematic plots illustrating movement of phase equilibrium boundaries of reaction (A) towards reaction (B) with increasing Y content in LYSO.

Comparing the two theoretical scenarios with the actual experimental result of thermal oxygenation process, one finds that for pure LSO or LYSO with high Lu content, Reaction (A) seems to located at a lower temperature side so that the separation of the phase boundary between Reaction (A) and Reaction (B) is larger to provide more room for thermal oxygenation (Scenario I). Increasing Y content in LYSO has a strong effect to move the Reaction (A) to higher temperature side approaching Reaction (B) and might even slightly cross it (Scenario II) (FIG. 12). One also finds that the location of reaction (B) is rather insensitive to the Y content in LYSO.

The phase relationship provides the stability field based on thermodynamic equilibrium of chemical reactions. Applicant is conducting the thermal oxygenation process within the stability field of Reaction (B). Based on this argument, then it would be very difficult to enhance the light yield performance of LYSO with high Y content. However, applicant finds that one can utilize the dynamics of chemical reaction to achieve the goal.

The redox Reaction (A) of Ce ion is a spoiler in the process. Applicant finds that not only this reaction is highly sensitive to Y content, but also the reaction is very reversible and fast without involving the physical addition or subtraction of materials. On the other hand, Reaction (B) involves direct addition and subtraction of oxygen. This is a very slow reaction process involving the physical diffusion of oxygen. Applicant has been trying to raise the temperature as high as possible in the thermal oxygenation process without crossing the phase boundary of Reaction (B) just to speed up the diffusion process. While the thermal oxygenation is a slow process controlled by the diffusion of oxygen into the crystal, the reverse of Reaction (B), the out-diffusion of oxygen from the crystal, is even slower. This provides the opportunity to achieve the goal of full oxygenation of high Y content LYSO crystals without the presence of $Ce^{4+}$ iond.

Figure 13:
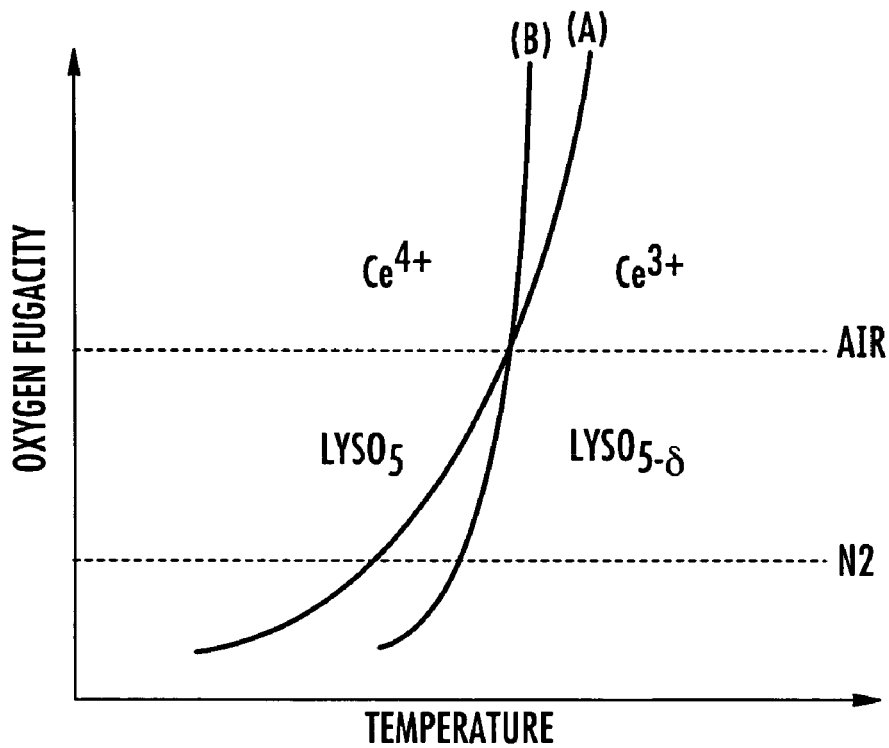
FIG. 13 is an oxygen fugacity vs. temperature diagram illustrating schematic plots of the phase equilibrium boundaries of reactions (A) and (B) based on scenario III in an oxygen fugacity vs. temperature diagram.

Let us consider the Scenario III situation such that Reaction (A) is closely overlapped with Reaction (B) (FIG. 13). Thermal oxygenation of oxygen vacancy in LYSO (on the left side of Reaction (B)) will simultaneously oxidize $Ce^{3+}$ into $Ce^{4+}$ (Reaction (A)). But this is not a problem. After the full oxygenation process, one can place the crystal in low oxygen or reducing or vacuum condition and anneal it back. Since Reaction (A) is fast and reversible, the $Ce^{4+}$ will be quickly reduced back to $Ce^{3+}$. On the other hand, the reverse of Reaction (B) is very sluggish. So even the crystal is theoretically on the right side of reaction (B), almost no oxygen will be lost given the short duration of the reduction process. In the end, one will have the crystal fully oxygenated but without $Ce^{4+}$ ion.

Now one has a complete process to achieve full oxygenation of LSO and LYSO crystals with any Y content without the trouble of having $Ce^{4+}$ ion within the crystal. One is able to increase of crystal yield without any waste due to yellowing of the crystal. One should know that the sequence of operation of thermal oxygenation and thermal reduction is important. One should thermally oxygenate the crystal first and followed by thermal reduction only if the crystal has turned yellow. If the crystal remains white after thermal oxygenation, no thermal reduction is needed. Moreover, reversing the sequence of thermal oxygenation and thermal reduction will not likely improve the yield, since the crystal after growth is always in the reduced state. Thermal reduction of the as-grown crystal will not improve the performance since all the oxygen vacancies still remain.

In testing the crystals produced, the light yield and energy resolution are measured using a standard photomultiplier tube (PMT) detector in a multi-channel analyzer (MCA). The sample to be measured is placed on the PMT detector and covered with a high reflectivity cup. On top of the cup, there is a radioactive source that will generate gamma rays. The typical radioactive sources used are Sodium$^{22}$ ($^{22}$Na), which produces 511 KeV gamma rays, and Cesium$^{137}$ ($^{137}$Cs), which produces 630 KeV gamma rays. The light yield and energy resolution are measured in the units of number of channels of the MCA. For calibration, NaI(Tl) and BGO are used as primary standards and then a calibrated sample of LYSO is used as a secondary standard. The detector system is set up in such a way that the maximum light output peak of BGO is set at 100 channels. Using this as the primary standard, the secondary LYSO standard will have the maximum light output peak located at 550 channels. In other words, the secondary standard light yield is 5.5 times more than that of BGO.

The MCA can also measure the energy spread around the maximum peak. It measures the full width half maximum (FWHM) of the energy peak again in unit of number of channels. For example, the LYSO secondary standard has a 10% energy resolution, and the FWHM of this standard is 55 channels. Before starting the measurement of crystal samples, the machine is first calibrated with the LYSO standard and adjusted so that the gain of the PMT will read exactly 550 channels. The MCA is then ready to read other test samples.

The following experimental examples have been conducted using the thermal oxygenation process on a variety of crystals prepared by the Czochralski melt pulling technique as known in the art. While a large number of sample crystals have now been treated according to the method of the invention, the examples provided below are representative.

EXAMPLE 1

A Ce:LYSO crystal having y=0.05 was cut into pixels of approximately 4×6×30 mm, resulting in ten individual samples which were then placed in an oven heated to 1100° C. for a period of 60 hours. The light yield (LY), the FWHM of the energy peak and energy resolution (ER %) before and after this thermal oxygenation process are listed in Table 1. It should also be understood that all test results shown in Tables 1-9 were measured at standard room temperature of approximately 250° C.

TABLE 1

|  | Sample # | | | | | | | | | |
| --- | --- | --- | --- | --- | --- | --- | --- | --- | --- | --- |
|  | 1 | 2 | 3 | 4 | 5 | 6 | 7 | 8 | 9 | 10 |
| Initial LY | 661 | 657 | 666 | 651 | 639 | 603 | 672 | 618 | 668 | 638 |
| FWHM | 115 | 117 | 79 | 102 | 77 | 75 | 82 | 82 | 81 | 62 |
| ER (%) | 17.4 | 17.8 | 11.9 | 15.7 | 12.1 | 12.4 | 12.2 | 13.3 | 12.1 | 9.7 |
| 60 hrs LY | 691 | 722 | 715 | 729 | 723 | 705 | 717 | 709 | 727 | 723 |
| FWHM | 61 | 63 | 64 | 66 | 61 | 54 | 60 | 62 | 61 | 62 |
| ER (%) | 8.8 | 8.7 | 9.0 | 9.1 | 8.4 | 7.7 | 8.4 | 8.7 | 8.4 | 8.6 |

The results show a general increase of LY following thermal oxygenation. More importantly, the energy resolution improves dramatically after treatment.

EXAMPLE 2

A Ce:LSO crystal with y=0.00 is cut into 6×6 ×25 mm³ pixels and the samples are placed in an oven heated to 1100° C. for a period of 60 hours. The results are shown in Table 2. The initial pixel light yield is quite low, around 300, and the energy resolution is also poor. After thermal oxygenation, however, the pixel light yield has doubled and shifted to 600. The samples still retained their original light yield peak and the LY became doubled-peaked with an energy resolution more than twice of the original. It was apparent that the same oxygenation treatment is insufficient for LSO, when compared to LYSO. In view of the first results, it was decided to treat the samples for an additional 60 hours at 1100° C. Following this second treatment, there is a clear improvement for both light yield performance and energy resolution. However, the double peak has not been totally eliminated, and three of the samples show two distinctly separated peaks.

TABLE 2

|  | Sample # | | | | | | | | |
| --- | --- | --- | --- | --- | --- | --- | --- | --- | --- |
|  | 1 | 2 | 3 | 4 | 5 | 6 | 7 | 8 | 9 |
| Initial LY | 281 | 231 | 286 | 313 | 313 | 252 | 324 | 286 | 328 |
| FWHM | 38 | 37 | 54 | 46 | 44 | 40 | 71 | 52 | 61 |
| ER (%) | 13.5 | 16.0 | 18.9 | 14.7 | 14.1 | 15.9 | 21.9 | 18.2 | 18.6 |
| 60 hrs LY | 601 | 614 | 591 | 614 | 616 | 609 | 621 | 573 | 608 |
| FWHM | 133 | 172 | 163 | 136 | 114 | 142 | 128 | 168 | 119 |
| ER (%) | 22.1 | 28.0 | 27.6 | 22.1 | 18.5 | 23.3 | 20.6 | 29.3 | 19.6 |
| 120 hrs LY | 652 | 664 | dbl | dbl | 675 | 663 | 691 | dbl | 675 |
| FWHM | 116 | 144 | — | — | 105 | 120 | 106 | — | 107 |
| ER (%) | 17.8 | 21.7 | — | — | 15.6 | 18.1 | 15.3 | — | 15.9 |

These results show that even though thermal oxygenation can greatly improve the light yield of pure LSO (y=0) crystal, the structure being less open, it is more difficult to achieve full oxygenation as compared with LYSO.

EXAMPLE 3

A Ce:YSO crystal with y=1.00 was cut into a small block of 6×6×10 mm³ and placed in an oven heated to 1100° C. for a period of 60 hours. The pixel has an initial light yield of 397 and an energy resolution of 10.6%. After the thermal oxygenation process, the crystal color turned to a light yellow, indicating conversion of at least part of the Ce dopant from the 3+ state to the 4+ state. $Ce^{3+}$ is an efficient blue emitter whereas $Ce^{4+}$ does not emit at all. Light yield measurement showed that the energy peak was located at 452, which is better than before treatment, and that post-treatment energy resolution is 10.0%. While thermal oxygenation does improve the light yield in this case, the improvement is more limited. It also seems that the oxygen diffusion is more easily obtained in YSO than LYSO, with concomittant oxidation of the cerium dopant. These results indicated a need for shortening the treatment time to prevent oxidation of cerium in this crystal.

EXAMPLE 4

A thick Ce:LYSO crystal slab with y=0.05 and dimensions of 20 mm thick by 85 mm in diameter was treated in an oven heated to 1100° C. for a period of 60 hours. The slab had an initial light yield of 385 and FWHM of 52. After treatment, the crystal shows a double peak at 390 and 680. It is thought that this effect is due to the limited diffusion depth of the oxygen so that only the outer skin region of the crystal is oxygenated, whereas the interior portion of the crystal still has original material with oxygen vacancies. This result indicates that pure thermal annealing will not change the light yield of the crystal. The interior portion of the crystal has undergone the same amount of heating but there is no detectable change in properties. Since the thermal oxygenation was not completed for the slab, the sample was placed back in the oven heated at 1100° C. for another 60 hours. Unfortunately, even after the second annealing, clear double peaks remain. This result led to the conclusion that since oxygen diffusion into the crystal is slow, it is difficult to oxygenate the interior of the sample when the crystal is too thick.

EXAMPLE 5

Temperature dependence of thermal oxygenation of Ce:LSO and Ce:LYSO crystals is tested using a special high temperature furnace capable of reaching a temperature of up to 1600° C. in air. Three sets of five identical pixels each, measuring 6×6×25 mm³, were taken from a Ce:LSO crystal having y=0.00 and a Ce:LYSO crystal having y=0.05. These three sets were placed in furnaces and heated simultaneously, one set at 1400° C. for 30 hours, one set at 1300° C. for 50 hours, and one set at 1200° C. for 80 hours, respectively. The parameters for each pixel were measured before and after this thermal oxygenation treatment. The results are listed below:

TABLE 3

At 1400° C. (Ln = LSO pixels, LYn = LYSO pixels, n = 1 to 5)

| | Sample # | | | | | | | | |
|---|---|---|---|---|---|---|---|---|---|
| | L1 | L2 | L3 | L4 | L5 | LY1 | LY2 | LY3 | LY4 | LY5 |
| Initial LY | 403 | 338 | 353 | 415 | 349 | 510 | 455 | 465 | 484 | 485 |
| FWHM | 43.5 | 42.0 | 42.6 | 44.3 | 68.0 | 47.1 | 54.0 | 45.6 | 47.7 | 46.5 |
| ER (%) | 10.8 | 12.4 | 12.1 | 10.7 | 19.5 | 9.2 | 11.9 | 9.8 | 9.9 | 9.6 |
| 30 hrs LY | 615 | 613 | 615 | 607 | 579 | 585 | 595 | 606 | 602 | 606 |
| FWHM | 57.5 | 61.3 | 57.6 | 63.9 | 64.2 | 48.1 | 48.6 | 45.7 | 48.1 | 45.1 |
| ER (%) | 9.3 | 10.0 | 9.4 | 10.5 | 11.1 | 8.2 | 8.2 | 7.5 | 8.0 | 7.4 |

TABLE 4

At 1300° C. (Ln = LSO pixels, LYn = LYSO pixels, n = 6 to 10)

| | Sample # | | | | | | | | |
|---|---|---|---|---|---|---|---|---|---|
| | L6 | L7 | L8 | L9 | L10 | LY6 | LY7 | LY8 | LY9 | LY10 |
| Initial LY | 413 | 412 | 378 | 389 | 318 | 451 | 490 | 485 | 467 | 486 |
| FWHM | 41.9 | 45.2 | 42.2 | 42.1 | 40.3 | 44.0 | 47.0 | 48.5 | 46.2 | 46.9 |
| ER (%) | 10.1 | 11.0 | 11.2 | 10.8 | 12.7 | 9.8 | 9.6 | 10.0 | 9.9 | 9.7 |
| 50 hrs LY | 627 | 618 | 605 | 617 | 641 | 623 | 620 | 635 | 633 | 629 |
| FWHM | 81.0 | 87.8 | 85.5 | 81.3 | 67.2 | 49.4 | 48.9 | 46.6 | 48.2 | 46.3 |
| ER (%) | 12.9 | 14.2 | 14.1 | 13.2 | 10.5 | 7.9 | 7.9 | 7.3 | 7.6 | 7.4 |

TABLE 5

At 1200° C. (Ln = LSO pixels, LYn = LYSO pixels, n = 11 to 15)

| | Sample # | | | | | | | | |
|---|---|---|---|---|---|---|---|---|---|
| | L11 | L12 | L13 | L14 | L15 | LY11 | LY12 | LY13 | LY14 | LY15 |
| Initial LY | 309 | 357 | 418 | 372 | 328 | 476 | 507 | 454 | 480 | 467 |
| FWHM | 34.9 | 40.5 | 45.2 | 42.8 | 67.7 | 49.2 | 48.1 | 46.0 | 46.6 | 46.9 |
| ER (%) | 11.3 | 11.3 | 10.8 | 11.5 | 20.6 | 10.3 | 9.5 | 10.1 | 9.7 | 10.0 |
| 80 hrs LY | 541 | 578 | 598 | 554 | 557 | 599 | 600 | 614 | 614 | 610 |
| FWHM | 97.5 | 96.8 | 107.7 | 104.8 | 100.0 | 46.7 | 46.9 | 45.7 | 47.6 | 44.3 |
| ER (%) | 18.0 | 16.7 | 18.0 | 18.9 | 18.0 | 7.8 | 7.8 | 7.4 | 7.8 | 7.3 |

It is clear from the result that oxygen diffusion is far more effective at higher temperatures. Between Ce:LSO and Ce:LYSO, the latter is much easier to be fully oxygenated during a much shorter treatment time. At 1400° C., it is possible to fully oxygenate both Ce:LSO and Ce:LYSO in 30 hours. After full oxygenation, there is great improvement in light yield (LY) and energy resolution (ER %) for both crystals. Moreover, even though the as-grown Ce:LYSO has distinctly better light yield and energy resolution as compared with Ce:LSO, once fully oxygenated there is substantially no difference in light yield between these two crystals. However, the overall energy resolution of Ce:LYSO is distinctly better than that of Ce:LSO, even when both are fully oxygenated. Still, for Ce:LSO, the energy resolution is also greatly improved after thermal oxygenation. For example, Sample L5 with initial LY of 349 and Er 19.5% can be improved to LY of 579 and ER 11.1% with full oxygenation.

EXAMPLE 6

Using the same high temperature furnace as in Example 5, we investigate the complete range of composition of YSO, LYSO and LSO family compounds. Pixels made from seven specific compositions were used for the thermal oxygenation test. They are pure YSO (y=1.00), LYSO with 15% Lu (y=0.85), LYSO with 30% Lu (y=0.70), LYSO with 50% Lu (y=0.50), LYSO with 70% Lu (y=0.30), LYSO with 85% Lu (y=0.15) and pure LSO (y=0.00). All pixels with the smallest dimensions no less than 6 mm. The thermal oxygenation temperatures and durations are 1400° C. for 30 hours, 1300° C. for 50 hours, 1200° C. for 80 hours and 1100° C. for 120 hours, respectively in order to compare the result in Example 5. Each pixel was measured before and after the thermal oxygenation. The results are listed below:

TABLE 6

At 1400° C. (YSO, LSO = pure compound, n % LY = % of Lu content in LYSO)

| | Sample # | | | | | | | |
|---|---|---|---|---|---|---|---|---|
| | YSO$_1$ | YSO$_2$ | 15% | 30% | 50% | 70% | 85% | LSO |
| Initial LY | 386 | 506 | 232 | 407 | 469 | 387 | 449 | 320 |
| FWHM | 29.6 | 41.7 | 45.1 | 35.8 | 47.2 | 35.7 | 57.4 | 39.3 |
| ER (%) | 7.7 | 8.2 | 19.4 | 8.8 | 10.1 | 9.2 | 12.8 | 12.3 |
| 30 hrs LY | 408 | 448 | 348 | 549 | 570 | 607 | 644 | 657 |

TABLE 6-continued

At 1400° C. (YSO, LSO = pure compound,
n % LY = % of Lu content in LYSO)

| | Sample # | | | | | | | |
|---|---|---|---|---|---|---|---|---|
| | YSO$_1$ | YSO$_2$ | 15% | 30% | 50% | 70% | 85% | LSO |
| FWHM | 31.3 | 35.9 | 54.0 | 41.4 | 44.3 | 46.9 | 48.3 | 57.0 |
| ER (%) | 7.7 | 8.0 | 15.5 | 7.5 | 7.8 | 7.7 | 7.5 | 8.7 |

TABLE 7

At 1300° C. (YSO, LSO = pure compound,
n % LY = % of Lu content in LYSO)

| | Sample # | | | | | | | |
|---|---|---|---|---|---|---|---|---|
| | YSO$_1$ | YSO$_2$ | 15% | 30% | 50% | 70% | 85% | LSO |
| Initial LY | 447 | 453 | 233 | 430 | 466 | 450 | 462 | 398 |
| FWHM | 34.5 | 35.5 | 45.1 | 44.7 | 52.1 | 53.6 | 68.3 | 45.7 |
| ER (%) | 7.7 | 7.8 | 19.4 | 10.4 | 11.2 | 11.9 | 14.8 | 11.5 |
| 30 hrs LY | 460 | 464 | 352 | 566 | 586 | 625 | 636 | 628 |
| FWHM | 35.8 | 31.9 | 36.2 | 41.9 | 51.1 | 46.8 | 46.9 | 87.4 |
| ER (%) | 7.8 | 6.9 | 10.3 | 7.4 | 8.7 | 7.5 | 7.4 | 13.9 |

TABLE 8

At 1200° C. (YSO, LSO = pure compound,
n % LY = % of Lu content in LYSO)

| | Sample # | | | | | | | |
|---|---|---|---|---|---|---|---|---|
| | YSO-1 | YSO-2 | 15% | 30% | 50% | 70% | 85% | LSO |
| Initial LY | 498 | 412 | 262 | 477 | 520 | 542 | 473 | 420 |
| FWHM | 37.5 | 36.7 | 33.3 | 46.4 | 54.8 | 61.1 | 57.5 | 69.9 |
| ER (%) | 7.5 | 8.9 | 12.7 | 9.7 | 10.5 | 11.3 | 12.2 | 16.6 |
| 30 hrs LY | 459 | 422 | 361 | 579 | 604 | 625 | 644 | 623 |
| FWHM | 31.2 | 35.2 | 39.9 | 36.6 | 44.3 | 44.6 | 50.6 | 97.8 |
| ER (%) | 6.8 | 8.3 | 11.1 | 6.3 | 7.3 | 7.1 | 7.9 | 15.7 |

TABLE 9

At 1100° C. (YSO, LSO = pure compound,
n % LY = % of Lu content in LYSO)

| | Sample # | | | | | | | | |
|---|---|---|---|---|---|---|---|---|---|
| | YSO$_1$ | YSO$_2$ | 15% | 30% | 50% | 70%$_1$ | 70%$_2$ | 85%$_1$ | 85%$_2$ | LSO |
| Initial LY | 441 | 453 | 250 | 473 | 512 | 525 | 520 | 442 | 500 | 384 |
| FWHM | 33.0 | 35.3 | 36.3 | 42.3 | 54.8 | 65.1 | 48.3 | 46.3 | 49.8 | 84.0 |
| ER (%) | 7.5 | 7.8 | 14.5 | 8.9 | 10.7 | 12.4 | 9.3 | 10.5 | 10.0 | 21.9 |
| 30 hrs LY | 490 | 466 | 349 | 582 | 621 | 618 | 646 | 646 | 671 | 607 |
| FWHM | 31.3 | 32.0 | 44.9 | 40.1 | 48.8 | 49.7 | 47.5 | 47.7 | 46.4 | 102.3 |
| ER (%) | 6.4 | 6.9 | 12.9 | 6.9 | 7.9 | 8.0 | 7.4 | 7.5 | 6.9 | 16.9 |

For pure LSO pixel, the result is the same as those in Example 5. Only at 1400° C., it is possible to fully oxygenate LSO. At lower temperature, the light yield improves but the energy resolution increases. For pure YSO, the result is consistent with Example 3. All the YSO pixels turn to light yellow in color at all temperatures after thermal oxygenation indicating the oxidation of $Ce^{3+}$ to $Ce^{4+}$. However, despite the loss of active emission center of $Ce^{3+}$ there seems no significant decrease in light yield nor change in energy resolution (ER). For LYSO pixels, the result is also very consistent. All the pixels shows no sign of any discoloration, even for 15% LYSO at 1400° C. The 15% LYSO which has the highest yttrium content of 85% starts with very poor light yield and energy resolution, there is a 50% improvement in light yield after thermal oxygenation. The energy resolution is improves except at the highest temperature. For the rest of the LYSO composition, the thermal oxygenation is completed at all temperatures. All samples show increases in light yields and decreases in energy resolution. Moreover, there is a systematic increase in final light yield with increase in Lutetium content in the crystal.

Thermal oxygenation at 1300° C. and 1200° C. show that Ce:LYSO pixels are fully oxygenated during the respective heating time, but Ce:LSO pixels are far from reaching full oxygenation. This is consistent with the thermal treatment result at 1100° C. and indicates that the active energy of oxygen diffusion for Ce:LSO is much higher than that for Ce;LYSO, so that much longer time are needed to fully oxygenate Ce:LSO. However, once fully oxygenated, the Ce:LSO pixels are functionally close to Ce:LYSO with only slightly higher energy resolution.

Applicant hypothesizes, without wishing to be bound thereto, that the large difference in response during thermal oxygenation shows the effect of the crystal's physical properties, that is, comparing Ce:LSO with Ce:LYSO. Applicant has found that with as small as approximately 1% content of Yttrium in Ce:LYSO, the crystal will show significant improvement in oxygen diffusion, as well as a narrowing of the energy resolution as compared to that of pure Ce:LSO. This is feature distinguishes pure Ce:LSO from Ce:LYSO. Ease of oxygenation increases with increasing yttrium content in Ce:LYSO. At the same time, however, the tendency to oxidize Ce from 3+ state to 4+ state also increases with higher yttrium content. It may be useful to carefully control both the time and temperature during thermal oxygenation of a specific crystal composition in order to maximize light yield from the crystal without further oxidizing the Ce component in the crystal.

EXAMPLE 7

We also examine the effect of thermal oxygenation on the light yield of Ce:LSO and Ce:LYSO as a function of temperature. We randomly select two Ce:LSO pixels and two Ce:LYSO (y=0.05) pixels. One of each is as-grown without thermal oxygenation. The other two are fully oxygenated Ce:LSO and Ce:LYSO. The sample is chilled or heated at different temperatures. Both light yield and energy resolution are measured at these temperatures. The result is shown in Table 10.

TABLE 10

Temperature Dependence of Light Yield Measurement:

| Sample | Centroid | FWHM | Energy R | T (° C.) | Δ |
|---|---|---|---|---|---|
| BGO | 100 | 11.45 | 11.45 | 23 | |
| LSO (untreated) | 486 | 50.57 | 10.4 | 2 | 100 |
| LSO (untreated) | 462 | 51.77 | 11.2 | 23 | 95.1 |
| LSO (untreated) | 452 | 37.96 | 8.4 | 41 | 93.0 |
| LSO (untreated) | 420 | 31.16 | 7.4 | 56 | 86.4 |
| LSO (oxygenated) | 685 | 48.93 | 7.1 | 2 | 100 |
| LSO (oxygenated) | 665 | 42.50 | 6.4 | 23 | 97.1 |
| LSO (oxygenated) | 676 | 49.18 | 7.3 | 41 | 98.7 |
| LSO (oxygenated) | 658 | 37.49 | 5.7 | 56 | 96.1 |
| LYSO (untreated) | 521 | 32.91 | 6.3 | 2 | 100 |
| LYSO (untreated) | 465 | 35.43 | 7.6 | 23 | 89.3 |
| LYSO (untreated) | 447 | 25.57 | 5.7 | 41 | 85.8 |
| LYSO (untreated) | 376 | 42.61 | 11.3 | 56 | 72.2 |
| LYSO (oxygenated) | 708 | 47.26 | 6.7 | 2 | 100 |
| LYSO (oxygenated) | 701 | 50.07 | 7.1 | 23 | 99.0 |
| LYSO (oxygenated) | 692 | 42.97 | 6.2 | 41 | 97.7 |
| LYSO (oxygenated) | 678 | 41.53 | 6.1 | 56 | 95.8 |

Crystal performance was measured at four temperatures: 2°, 23°, 41° and 56°, respectively. It was found that both as-grown Ce:LSO and Ce:LYSO has defect centers due to oxygen deficiency. These defect centers can act as non-radiative emission centers which will take the scintillating energy away from emission. The efficiency of such non-radiative energy removal increases with temperature. For Ce:LSO, there is a drop of 14% in light yield from 2° to 56° C. For Ce:LYSO with easier oxygen diffusion, the drop is doubled to 28% at the same temperature range. However, after the thermal oxygenation, these oxygen deficient defects are eliminated. Both Ce:LSO and Ce:LYSO shows the same low temperature dependence of light yield of only 4% at the same temperature range.

The result shows that thermal oxygenation is a key post-growth process to restore Ce:LSO, Ce:LYSO and Ce:YSO to their intrinsic scintillating properties. Without it, the as-grown crystals will show large property variation and inconsistent behavior during scintillating process.

The results also support the idea that LYSO may be a preferred candidate crystal in the process of the invention. Moreover, since the treatment is a thermal diffusion process, it may be desirable to have at least one of the dimensions of the crystal sample to be sufficiently small to shorten the oxygen diffusion path and effectively eliminate the oxygen vacancy defect and increase the energy resolution of the crystals. Thermal diffusion of oxygen can be improved at higher temperatures. However, increasing the temperature also increases the risk of excessive oxygenation of the crystal and oxidation of the $Ce^{3+}$ ion into $Ce^{4+}$ non-emitting state. Once the cerium has been oxidized, the non-emitting atom may impair the light emitting center and will drastically affect the light yield of the crystal.

Figure 3:
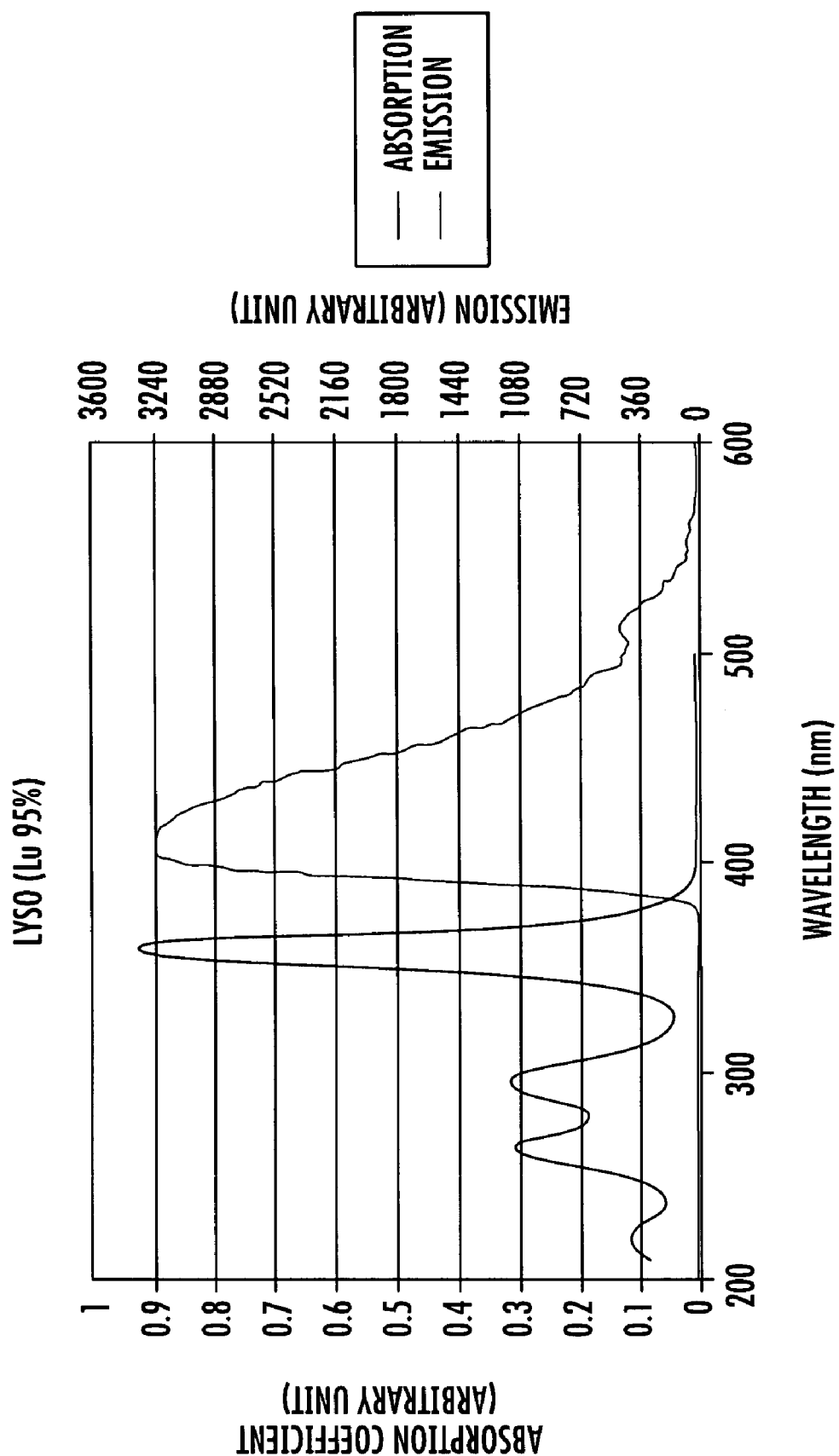
FIG. 3 is a line graph showing the absorption and emission spectra of LYSO, as in the prior art.
Figure 4:
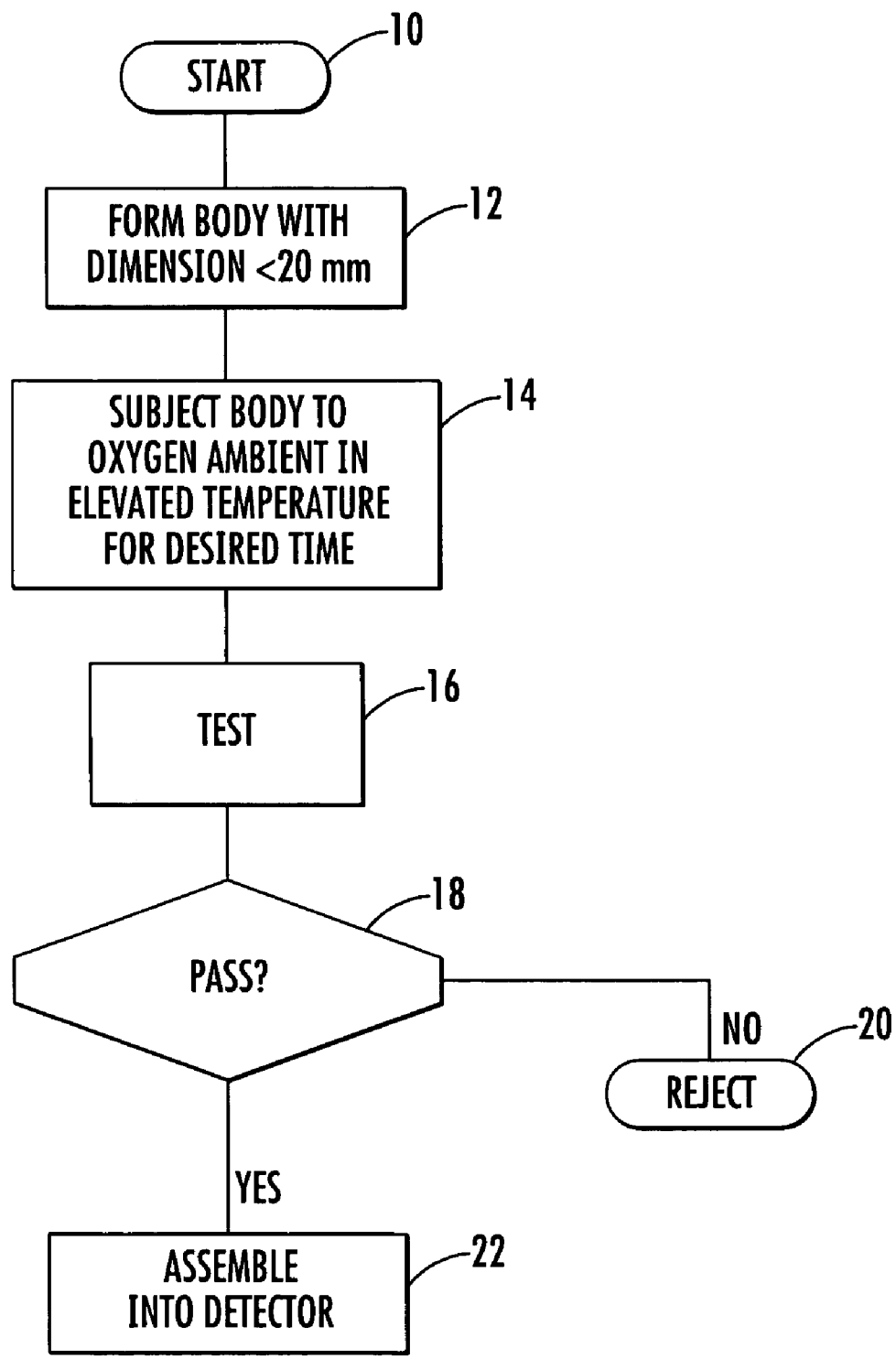
FIG. 4 is a flow diagram showing a portion of an embodiment of the method of the invention.
Figure 5:
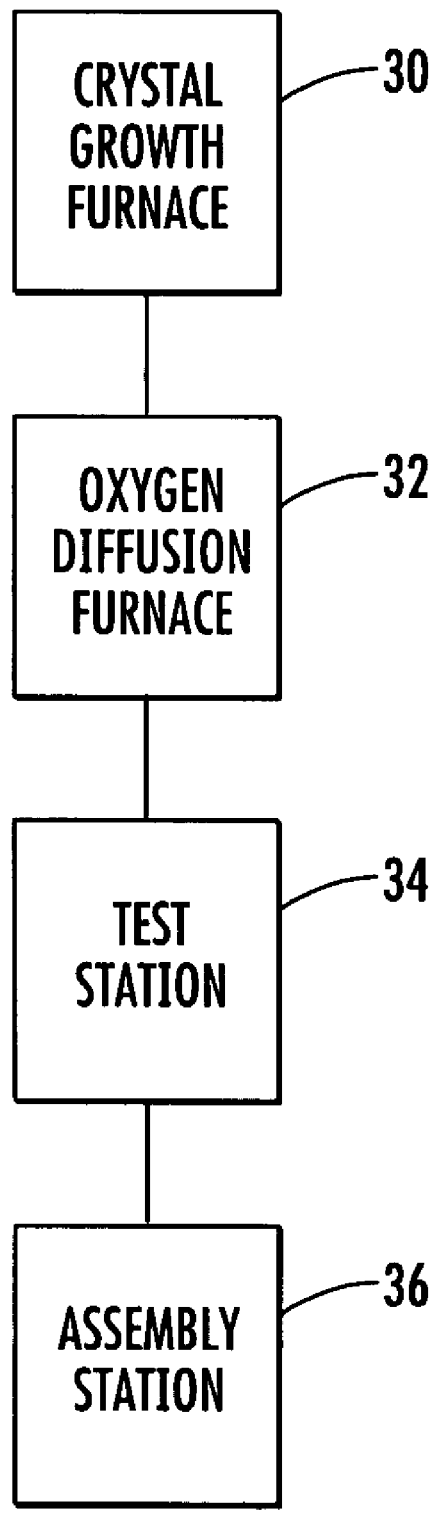
FIG. 5 illustrates an overall industrial process employing the present invention.
Figure 6:
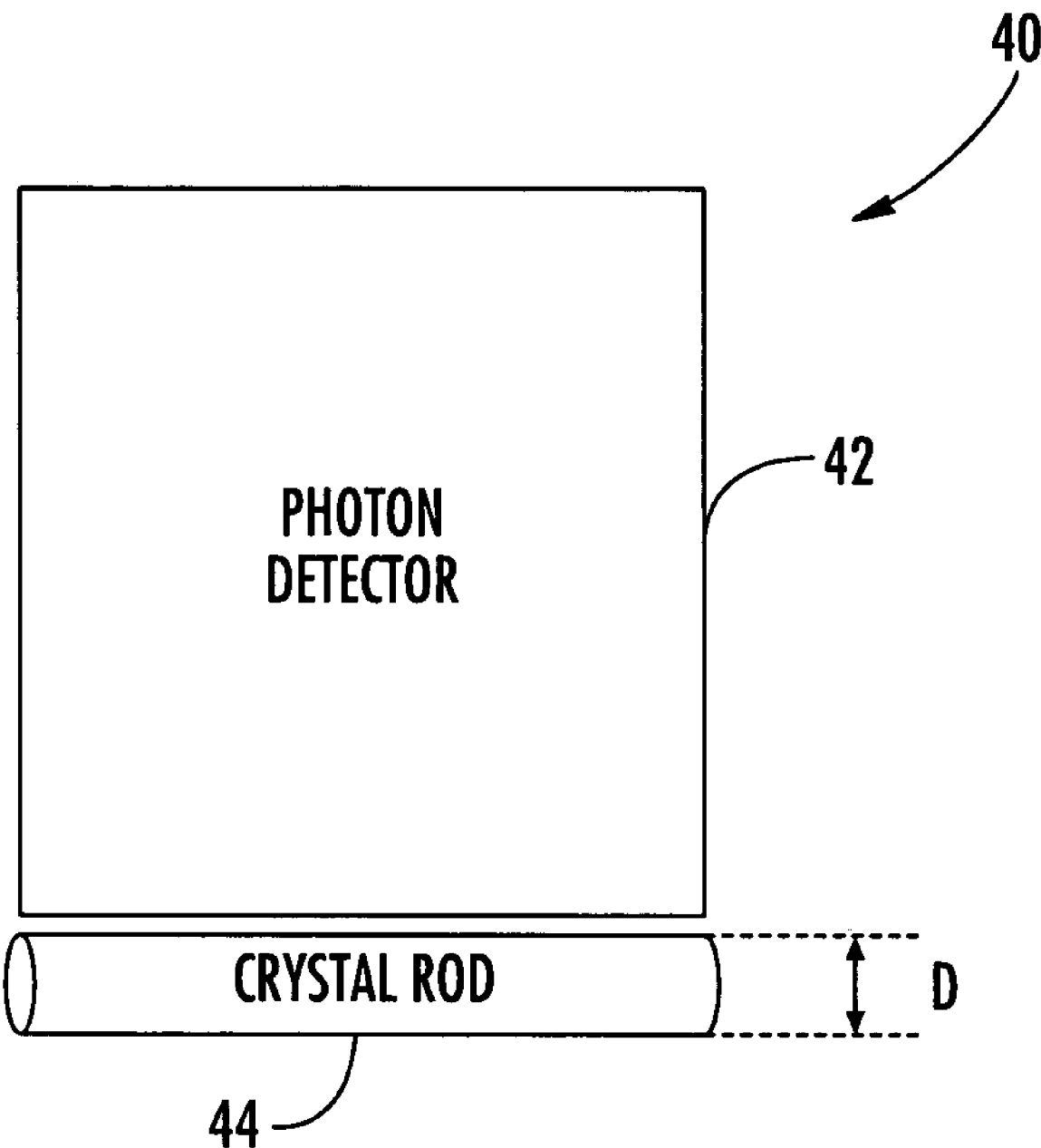
FIG. 6 is a schematic diagram of a scintillation detector employing a rod-shaped crystal enhanced according to the invention.
Figure 7:
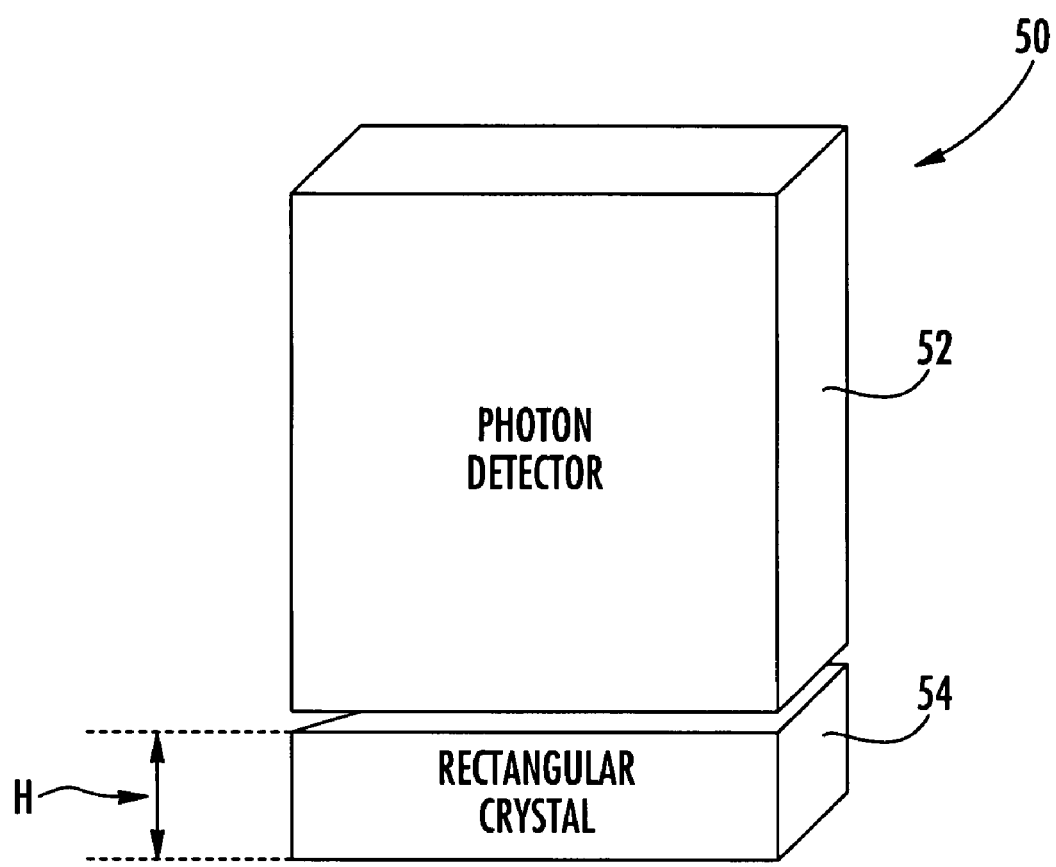
FIG. 7 is a schematic diagram of a scintillation detector employing a rectangular crystal enhanced according to the invention.

Referring now to the FIGS. 3 and 4 to further illustrate the invention, FIG. 3 is a flow diagram generally showing the process of the invention as described. From the start 10 a crystal body is formed 12 having preferably at least one dimension of 20 mm or less. The crystal body is heated 14 in an oxygen ambient for a desired time. Following oxygenation, the crystal is tested 16 to determine whether its light yield has been sufficiently improved and is either passed 18 or rejected 20. Crystals which pass are then assembled into scintillation detectors 22. FIG. 4 generally illustrates the overall industrial process stations in which the invention is incorporated. A crystal is grown in a crystal growth furnace 30. The as-grown crystal is then placed in an oxygen diffusion furnace 32 for oxygenation. Following oxygenation, the crystal proceeds to a test station 34, where it is evaluated for its light yield performance. A crystal meeting performance requirements is then directed to an assembly station 36, where it is assembled into a scintillation detector. FIG. 5 shows a typical scintillation detector 40, which includes at least a photon detector 42 and a crystal 44 enhanced according to the invention. In this case, the crystal shown is a rod-shaped crystal, having a predetermined diameter D of a dimension suitable for oxygenation. FIG. 6 illustrates another scintillation detector 50, which includes a photon detector 52 and, in this case, a rectangular crystal 54 enhanced by the process of the present invention. The rectangular crystal has a predetermined height H of a dimension suitable for oxygenation according to the invention.

EXAMPLE 8

To test the effect of thermal reduction after thermal oxygenation on light yield and energy resolution, applicant selected a group of materials which can represent a wide spectrum of compositions in the YSO-LYSO-LSO system. Applicant first measured the material before the oxygenation process. Applicant then heated them in air at 1300° C. for 30 hours to achieve full oxygenation. All the samples chosen here showed light yellow color after the treatment. We measured the light yield and energy resolution. The samples were then heated under nitrogen ($N_2$) atmosphere at 1300° C. for 3 hours. After the treatment, all samples turned to clear white without any trace of yellow. Applicant then made the final measurement. The result of these measurements is listed in Table 11, below.

TABLE 11

The effect of thermal reduction on LYSO and YSO samples that turn yellow after the thermal oxidation.

| | Samples# | | | | | |
|---|---|---|---|---|---|---|
| | LYSO-1 | LYSO-2 | LYSO-3 | low-Lu rod | low-Lu rod | YSO disk |
| As-produced before any treatment: (white) | | | | | | |
| Light Yield | 493 | 479 | 520 | 483 | 494 | 461 |
| FWHM | 56.2 | 50.9 | 56.7 | 52.1 | 54.7 | 39.3 |
| ER (%) | 11.40 | 10.63 | 10.90 | 10.79 | 11.07 | 8.52 |
| After thermal oxygenation: (light yellow) | | | | | | |
| Light Yield | 571 | 580 | 574 | 546 | 520 | 440 |
| FWHM | 45.4 | 56.1 | 42.3 | 47.2 | 52.3 | 47.8 |
| ER (%) | 7.95 | 9.67 | 7.37 | 8.64 | 10.05 | 10.86 |
| After thermal reduction: (white) | | | | | | |
| Light Yield | 651 | 649 | 660 | 632 | 612 | 552 |
| FWHM | 37.4 | 42.9 | 38.4 | 34.9 | 42.9 | 43.9 |
| ER (%) | 5.74 | 6.61 | 5.82 | 5.52 | 7.01 | 7.95 |

It is clear from all the examples that thermal oxygenation is the primary process to eliminate the oxygen vacancy defect to restore the intrinsic light yield and energy resolution of LYSO crystal. As long as the crystal does not turn yellow, one is able to achieve light yield over 6 times or more that of our BGO standard without the need of thermal reduction. The small variation of light yield between 6 and 7 times of BGO is attributed to other secondary effect from impurity or other unknown factors. So far we found that all the known secondary factors can only hurt or reduce the light yield but never able to enhance it. When the crystal turns yellow after thermal oxygenation, it only means that we did not cross the phase boundary of Reaction (A). It is by no means the end of the usefulness of this crystal. The thermal reduction is a rescue process to revert the $Ce^{4+}$ back to $Ce^{3+}$ without causing a serious loss of oxygen in the crystal. It is an insurance to guarantee the near total elimination of the $Ce^{4+}$ ions within the crystal which is a nuisance and causes the reduction of light yield by self absorption. From a manufacturing point of view, thermal reduction after thermal oxygenation will greatly increase the yield of high performance LYSO crystal.

Turning now additionally to the flowchart 60 shown in FIG. 13 the reducing method aspects in accordance with the invention are explained and summarized for convenience. From the start (Block 62), the method includes providing or starting with a doped scintillation crystal with a dopant in a first oxidation state, such as cerium in the 4+ state (Block 64). Thereafter and before stopping at Block 68, the method illustratively includes at Block 66 reducing at least some of the dopant, such as cerium, from the first oxidation state, such as 4+ for cerium, to a second lower oxidation state, such as 3+ for cerium. Scandium may also be used as a dopant as will be appreciated by those of skill in the art.

The scintillation crystal may comprise a rare earth silicate selected from the group consisting of lutetium oxyorthosilicate (LSO), lutetium yttrium oxyorthosilicate (LYSO), yttrium oxyorthosilicate (YSO), gadolinium oxyorthosilicate (GSO), gadolinium yttrium oxyorthosilicate (GYSO), lutetium gadolinium oxyorthosilicate (LGSO), and lutetium gadolinium yttrium oxyorthosilicate (LGYSO). The reducing may be applicable to other doped scintillation crystals as well. As explained above, the reduction has been found to enhance the light emission of the doped scintillation crystal, for example.

The reducing at Block 66 may be performed thermally and may be done in an oxygen-free ambient. For example, the heating may include heating at a temperature in a range of about 1100° C. to 1400° C. for a time in a range of about two to five hours.

The reducing may be used by itself to remediate scintillation crystals that have low light yield and as may appear yellow as indicative of the presence of the 4+ oxidation state of the cerium dopant, for example. In addition, the reducing can be used in combination with an initial manufacturing treatment step that enhances crystal performance by filling oxygen vacancies in the crystal as described in the parent applications which have been found to show significant enhancements. Thus, as now explained with reference to the flowchart 70 of FIG. 15, the invention is also directed to a method of enhancing performance of a doped scintillation crystal having oxygen vacancies therein as provided at Block 74. After the start (Block 74) and providing the doped scintillation crystal with oxygen site vacancies (Block 74), the method illustratively includes at Block 76 adding oxygen to fill at least some of the oxygen vacancies and having an effect of oxidizing the dopant, such as cerium, to a first oxidation state, such as the 4+ state for cerium. Adding oxygen may comprise heating the doped scintillation crystal in an oxygen containing ambient as described in greater detail above. Thereafter, at Block 78 and before stopping at Block 80, the method also illustratively includes reducing at least some of the dopant from the first oxidation state, such as 4+ for cerium, to the second oxidation state, such as 3+ for cerium.

The invention is applicable to a single crystal having the general composition, $Ce_{2x}(Lu_{1-y}Y_y)_{2(1-x)}SiO_5$ where x=approximately 0.00001 to approximately 0.05 and y=approximately 0.00 to approximately 1.00, preferably where x ranges from approximately 0.0001 to approximately 0.001 and y ranges from approximately 0.02 to approximately 0.98. The crystal is useful as a scintillation detector responsive to gamma ray or similar high energy radiation. The scintillation properties in terms of light yield and energy resolution can be maximized by first thermally oxygenated in air or any pressurized oxygenated ambient at temperatures approximately 400° C. to 2000° C., preferably 1100° C. to 1400° C. for an extended period of time from approximately 1 to 2000 hours, preferably approximately 20 to 100 hours. After thermal oxygenation, the crystal will then go through a thermal reduction process in a oxygen-free ambient at temperatures approximately 400° C. to 2000° C., preferably 1100° C. to 1400° C. for an extended period of time from approximately 1 to 200 hours, preferably approximately 2 to 5 hours.

The oxygen filling techniques and/or reducing techniques may be used for other many types of scintillation crystals as described herein. Accordingly, in the drawings and specification, there have been disclosed typical preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed is:

1. A method of treating a doped scintillation crystal comprising a dopant in a first oxidation state, the method comprising:
    reducing at least some of the dopant from the first oxidation state to a second oxidation state lower than the first oxidation state.

2. The method according to claim 1 wherein the reducing causes the doped scintillation crystal to have greater light emission than when in the first oxidation state.

3. The method according to claim 1 wherein the doped scintillation crystal comprises a doped rare earth silicate; and wherein the dopant comprises a rare earth different than the rare earth silicate.

4. The method according to claim 3 wherein the rare earth silicate is selected from the group consisting of lutetium oxyorthosilicate (LSO), lutetium yttrium oxyorthosilicate (LYSO), yttrium oxyorthosilicate (YSO), gadolinium oxyorthosilicate (GSO), gadolinium yttrium oxyorthosilicate (GYSO), lutetium gadolinium oxyorthosilicate (LGSO), and lutetium gadolinium yttrium oxyorthosilicate (LGYSO).

5. The method according to claim 3 wherein the dopant is selected from the group consisting of cerium and scandium.

6. The method according to claim 1 wherein the first oxidation state is a 4+ oxidation state and wherein the second oxidation state is a 3+ oxidation state.

7. The method according to claim 1 wherein reducing comprises thermally reducing.

8. The method according to claim 7 wherein thermally reducing comprises heating the doped scintillation crystal in an oxygen-free ambient.

9. The method according to claim 8 wherein heating comprises heating at a temperature in a range of about 1100° C. to 1400° C.

10. The method according to claim 8 wherein heating comprises heating for a time in a range of about two to five hours.

11. A method of enhancing performance of a doped scintillation crystal comprising a rare earth silicate doped with cerium in a 4+ oxidation state, the method comprising:
    thermally reducing at least some of the cerium from the 4+ oxidization state to a 3+ oxidation state.

12. The method according to claim 11 wherein the rare earth silicate is selected from the group consisting of lutetium oxyorthosilicate (LSO), lutetium yttrium oxyorthosilicate (LYSO), yttrium oxyorthosilicate (YSO), gadolinium oxyorthosilicate (GSO), gadolinium yttrium oxyorthosilicate (GYSO), lutetium gadolinium oxyorthosilicate (LGSO), and lutetium gadolinium yttrium oxyorthosilicate (LGYSO).

13. The method according to claim 11 wherein thermally reducing comprises heating the doped scintillation crystal in an oxygen-free ambient.

14. The method according to claim 13 wherein heating comprises heating at a temperature in a range of about 1100° C. to 1400° C. for a time in a range of about two to five hours.

15. A method of enhancing performance of a doped scintillation crystal comprising a doped rare earth silicate having oxygen vacancies therein, the method comprising:
    adding oxygen to fill at least some of the oxygen vacancies and having an effect of oxidizing the dopant to a first oxidation state; and
    reducing at least some of the dopant from the first oxidation state to a second oxidation state lower than the first oxidation state.

16. The method according to claim 15 wherein the reducing causes the doped scintillation crystal to have a higher light emission than when in the oxidized state.

17. The method according to claim 15 wherein the rare earth silicate is selected from the group consisting of lutetium oxyorthosilicate (LSO), lutetium yttrium oxyorthosilicate (LYSO), yttrium oxyorthosilicate (YSO), gadolinium oxyorthosilicate (GSO), gadolinium yttrium oxyorthosilicate (GYSO), lutetium gadolinium oxyorthosilicate (LGSO), and lutetium gadolinium yttrium oxyorthosilicate (LGYSO).

18. The method according to claim 15 wherein the dopant is selected from the group consisting of cerium and scandium.

19. The method according to claim 15 wherein the first oxidation state is a 4+ oxidation state and wherein the second oxidation state is a 3+ oxidation state.

20. The method according to claim 15 wherein reducing comprises thermally reducing.

21. The method according to claim 20 wherein thermally reducing comprises heating the doped scintillation crystal in an oxygen-free ambient.

22. The method according to claim 21 wherein heating comprises heating at a temperature in a range of about 1100° C. to 1400° C.

23. The method according to claim 21 wherein heating comprises heating for a time in a range of about two to five hours.

24. The method according to claim 15 wherein adding oxygen comprises heating the doped scintillation crystal in an oxygen containing ambient.

* * * * *

UNITED STATES PATENT AND TRADEMARK OFFICE
CERTIFICATE OF CORRECTION

PATENT NO. : 7,397,034 B2
APPLICATION NO. : 11/230167
DATED : July 8, 2008
INVENTOR(S) : Bruce H. T. Chai, David Y. Chai and Randall A. Lux It is certified that error appears in the above-identified patent and that said Letters Patent is hereby corrected as shown below:

| | |
|---|---|
| Column 3, Line 30 | Delete: "C.," <br> Insert: --C,-- |
| Column 3, Line 31 | Delete: "C." <br> Insert: --C-- |
| Column 3, Line 31 | Delete: "C.," <br> Insert: --C,-- |
| Column 5, Line 4 | Delete: "C." <br> Insert: --C-- |
| Column 8, Line 4 | Delete: "$Ce^4+$" <br> Insert: --$Ce^{4+}$-- |
| Column 8, Line 7 | Delete: "$Ce^4+$" <br> Insert: --$Ce^{4+}$-- |
| Column 8, Line 45 | Delete: "done massive" <br> Insert: --done a massive-- |
| Column 9, Line 13 | Delete: "to located" <br> Insert: --to be located-- |
| Column 9, Line 47 | Delete: "iond" <br> Insert: --ions-- |
| Column 10, Line 60 | Delete: "C." <br> Insert: --C-- |
| Column 10, Line 67 | Delete: "250°" <br> Insert: --25°-- |
| Column 11, Line 22 | Delete: "C." <br> Insert: --C-- |
| Column 11, Line 64 | Delete: "C." <br> Insert: --C-- |

UNITED STATES PATENT AND TRADEMARK OFFICE
CERTIFICATE OF CORRECTION

| | |
|---|---|
| PATENT NO. | : 7,397,034 B2 |
| APPLICATION NO. | : 11/230167 |
| DATED | : July 8, 2008 |
| INVENTOR(S) | : Bruce H. T. Chai, David Y. Chai and Randall A. Lux |

It is certified that error appears in the above-identified patent and that said Letters Patent is hereby corrected as shown below:

| | |
|---|---|
| Column 12, Line 33 | Delete: "C." <br> Insert: --C-- |
| Column 12, Line 46 | Delete: "C." <br> Insert: --C-- |
| Column 12, Line 59 | Delete: "C." <br> Insert: --C-- |
| Column 12, Line 63 | Delete: "C." <br> Insert: --C-- |
| Column 12, Line 64 | Delete: "C." <br> Insert: --C-- |
| Column 13, Table 3 | Delete: "C." <br> Insert: --C-- |
| Column 13, Table 4 | Delete: "C." <br> Insert: --C-- |
| Column 13, Table 5 | Delete: "C." <br> Insert: --C-- |
| Column 13, Line 49 | Delete: "C." <br> Insert: --C-- |
| Column 14, Line 48 | Delete: "LSO" <br> Insert: --LYSO-- |
| Column 14, Line 50 | Delete: "C." <br> Insert: --C-- |
| Column 14, Line 51 | Delete: "C." <br> Insert: --C-- |

UNITED STATES PATENT AND TRADEMARK OFFICE
CERTIFICATE OF CORRECTION

PATENT NO. : 7,397,034 B2
APPLICATION NO. : 11/230167
DATED : July 8, 2008
INVENTOR(S) : Bruce H. T. Chai, David Y. Chai and Randall A. Lux It is certified that error appears in the above-identified patent and that said Letters Patent is hereby corrected as shown below:

| | |
|---|---|
| Column 15, Table 6 | Delete: "C." <br> Insert: --C-- |
| Column 15, Table 7 | Delete: "C." <br> Insert: --C-- |
| Column 15, Table 8 | Delete: "C." <br> Insert: --C-- |
| Column 15, Table 9 | Delete: "C." <br> Insert: --C-- |
| Column 16, Line 2 | Delete: "C." <br> Insert: --C-- |
| Column 16, Line 12 | Delete: "shows" <br> Insert: --show-- |
| Column 16, Line 16 | Delete: "improves" <br> Insert: --improved-- |
| Column 16, Line 24 | Delete: "C." <br> Insert: --C-- |
| Column 16, Line 28 | Delete: "C." <br> Insert: --C-- |
| Column 16, Line 30 | Delete: "Ce;LYSO" <br> Insert: --Ce:LYSO-- |
| Column 17, Table 10 | Delete: "C." <br> Insert: --C-- |
| Column 17, Line 44 | Delete: "has" <br> Insert: --have-- |

UNITED STATES PATENT AND TRADEMARK OFFICE
CERTIFICATE OF CORRECTION

PATENT NO.        : 7,397,034 B2
APPLICATION NO.   : 11/230167
DATED             : July 8, 2008
INVENTOR(S)       : Bruce H. T. Chai, David Y. Chai and Randall A. Lux It is certified that error appears in the above-identified patent and that said Letters Patent is hereby corrected as shown below:

| | |
|---|---|
| Column 18, Line 58 | Delete: "C." <br> Insert: --C-- |
| Column 18, Line 62 | Delete: "C." <br> Insert: --C-- |
| Column 20, Line 26 | Delete: "C." <br> Insert: --C-- |
| Column 20, Line 64 | Delete: "C." <br> Insert: --C-- |
| Column 20, Line 65 | Delete: "C." <br> Insert: --C-- |
| Column 21, Line 1 | Delete: "a" <br> Insert: --an-- |
| Column 21, Line 2 | Delete: "C." <br> Insert: --C-- |
| Column 21, Line 3 | Delete: "C." <br> Insert: --C-- |
| Column 21, Line 50 Claim 9 | Delete: "C." <br> Insert: --C-- |
| Column 22, Line 2 Claim 11 | Delete: "oxidization" <br> Insert: --oxidation-- |

UNITED STATES PATENT AND TRADEMARK OFFICE
CERTIFICATE OF CORRECTION

PATENT NO. : 7,397,034 B2
APPLICATION NO. : 11/230167
DATED : July 8, 2008
INVENTOR(S) : Bruce H. T. Chai, David Y. Chai and Randall A. Lux It is certified that error appears in the above-identified patent and that said Letters Patent is hereby corrected as shown below:

Column 22, Line 15 Claim 14   Delete: "C."
                              Insert: --C--

Column 22, Line 47 Claim 22   Delete: "C."
                              Insert: --C--

Signed and Sealed this

Eighteenth Day of November, 2008

JON W. DUDAS
*Director of the United States Patent and Trademark Office*